(12) United States Patent
Bergendahl et al.

(10) Patent No.: US 11,876,023 B2
(45) Date of Patent: Jan. 16, 2024

(54) CONFORMAL FILM THICKNESS DETERMINATION USING ANGLED GEOMETRIC FEATURES AND VERTICES TRACKING

(71) Applicant: International Business Machines Corporation, Armonk, NY (US)

(72) Inventors: Marc A. Bergendahl, Rensselaer, NY (US); Christopher J. Penny, Saratoga Springs, NY (US); James John Demarest, Rensselaer, NY (US); Jean Wynne, Nassau, NY (US); Christopher J. Waskiewicz, Rexford, NY (US); Jonathan Fry, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 17/554,249

(22) Filed: Dec. 17, 2021

(65) Prior Publication Data
US 2023/0197531 A1    Jun. 22, 2023

(51) Int. Cl.
*H01L 23/498* (2006.01)
*H01L 21/66* (2006.01)

(52) U.S. Cl.
CPC ........ *H01L 22/12* (2013.01); *H01L 23/49822* (2013.01); *H01L 23/49827* (2013.01)

(58) Field of Classification Search
None
See application file for complete search history.

(56) References Cited

U.S. PATENT DOCUMENTS

| | | | |
|---|---|---|---|
| 4,695,797 | A | 9/1987 | Deutsch et al. |
| 5,450,205 | A | 9/1995 | Sawin et al. |
| 6,218,313 | B1 | 4/2001 | Tomita et al. |
| 6,956,659 | B2 | 10/2005 | Grodnensky |
| 7,807,996 | B2 | 10/2010 | Cho et al. |
| 7,955,876 | B2 | 6/2011 | Kinoshita |
| 8,312,393 | B2 | 11/2012 | Lindau et al. |
| 8,588,511 | B2 | 11/2013 | Liu et al. |
| 9,107,302 | B2 | 8/2015 | Cagle et al. |
| 2015/0298282 | A1 | 10/2015 | Vukkadala et al. |
| 2023/0197531 | A1* | 6/2023 | Bergendahl ............. H01L 22/12 257/499 |

FOREIGN PATENT DOCUMENTS

WO    2016135204 A1    9/2016

\* cited by examiner

*Primary Examiner* — Jack S Chen
(74) *Attorney, Agent, or Firm* — CANTOR COLBURN LLP; Samuel Waldbaum

(57) ABSTRACT

Embodiments of the invention provide a method that includes forming an IC layer having an inactive region and an active region. The active region includes a device-under-fabrication (DUF). The inactive region includes a geometric feature having a geometric shape. A film is deposited over the active DUF and the geometric feature such that a first portion of the film will be part of the active DUF, and such that a second portion of the film is over the geometric feature. A geometric shape of the film over the geometric feature matches the geometric shape of the geometric feature. Determining a thickness of the film is based at least in part a difference between a footprint of the geometric shape of the film and a footprint of the geometric shape of the geometric feature.

9 Claims, 17 Drawing Sheets

Equation-A1    $T_{thickness} = \sin(\alpha/2) * D_{distance}$ (D Measured as 2D between Bowtie Shapes and $\alpha$ known from shape design; FIG. 8)

Equation-A2    $T_{thickness} = \sin(\alpha/2) * D_{distance}$ (D Measured from 2D+S between Mirrored Shapes and $\alpha$ & S known from shape design; FIG. 10B)

Equation-A3    $T_{thickness} = \sin(\alpha/2) * D_{distance}$ (D Measured with reference to shape Vertex prior to definition using referential positioning information and $\alpha$ known from shape design; FIG. 11B)

Equation-A4    $T_{thickness} = \sin(\alpha/2) * D_{distance}$ (D Measured with reference to shape Vertex prior to definition using referential positioning information and $\alpha$ known from shape design; FIG. 11D)

FIG. 7

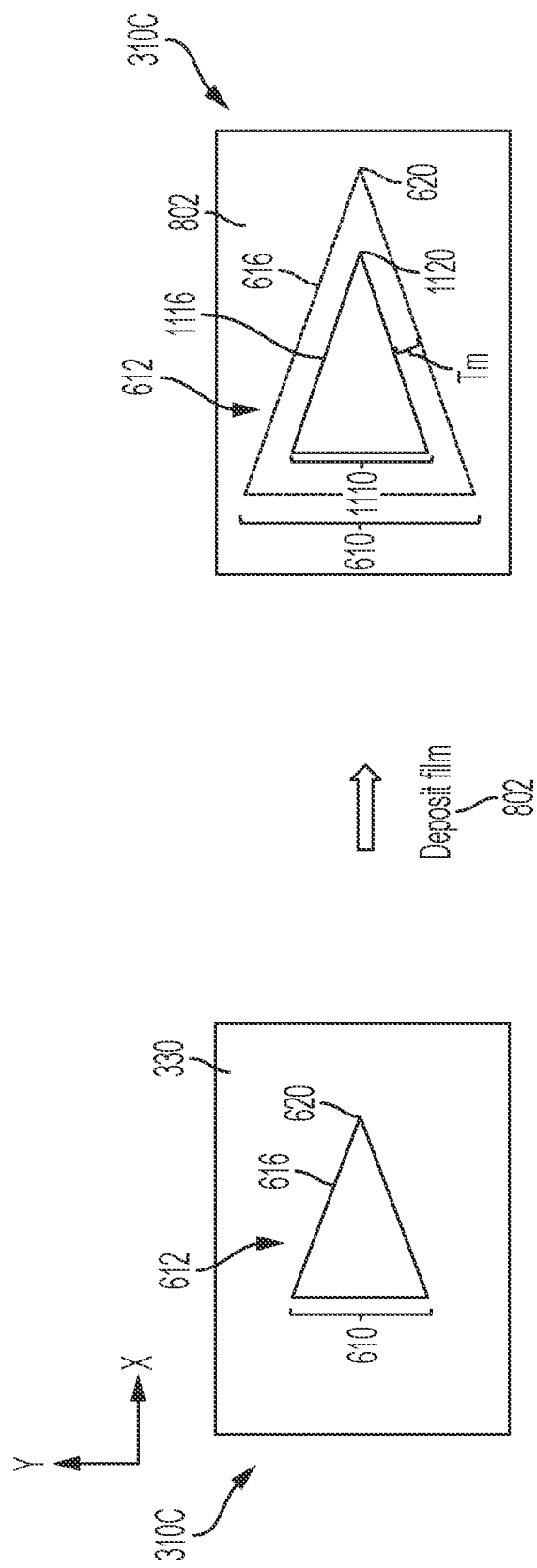

CONFORMAL FILM THICKNESS DETERMINATION USING ANGLED GEOMETRIC FEATURES AND VERTICES TRACKING

BACKGROUND

The present invention generally relates to fabrication methods and resulting structures for semiconductor devices. More specifically, the present invention relates to fabrication methods, fabrication systems, and resulting structures configured and arranged to determine the thickness of a conformally deposited film using angled geometric features and vertices tracking.

Integrated circuit (IC) wafer fabrication incorporates metrology and inspection operations to assist with management of the overall IC wafer fabrication process. Inspection operations use inspection equipment to check for compliance or non-compliance with the overall IC design and/or specific IC performance criteria. A function of inspection equipment is finding defects and specifying their locations using, for example, position coordinates. Metrology refers broadly to various methods of measuring numbers and volumes, mainly by using various types of metrology equipment. Metrology is a comprehensive concept that includes simple measurements, as well as measurements that factor in errors, accuracy, and the performance and mechanisms of metrology equipment.

There can be several hundred steps in known IC wafer fabrication processes, and it can take between four (4) and eight (8) weeks to fabricate a single IC wafer. Metrology and inspection operations are taken or sampled at critical points of an IC wafer fabrication process to ensure that a certain yield can be confirmed and maintained. Metrology and/or inspection measurements that indicate an error at a critical fabrication point can initiate a corrective action, including, for example, removal of the defective IC wafer from the fabrication line and initiation of rework operations. Newly designed ICs can go through several thousand metrology processes for one wafer during the start-up period of its fabrication.

An example metrology operation is measuring the thickness of selected films on the surface of an IC wafer-under-fabrication using, for example, an ellipsometer. An ellipsometer is a known type of metrology equipment that uses optical techniques to characterize the thickness (depth) of thin films. By measuring a change in polarization of light reflected from a thin film, an ellipsometer can computer a film's thickness by comparing the change in polarization to a model.

SUMMARY

Embodiments of the invention provide a method of fabricating a multi-layered integrated circuit (IC). The method includes forming an IC layer having an inactive region and an active region. The active region includes an active device-under-fabrication (DUF). The inactive region includes an inactive feature including a geometric feature having a geometric shape that extends along an X-axis, a Y-axis, and a Z-axis. A film is deposited over the active DUF and the geometric feature such that a first portion of the film will be part of the active DUF, and such that a second portion of the film is over the geometric feature. The second portion of the film is over the geometric feature such that a geometric shape of the film matches the geometric shape of the geometric feature. A footprint of the geometric shape of the film in a plane defined by the X-axis and the Y-axis is different from a footprint of the geometric shape of the geometric feature in the plane defined by the X-axis and the Y-axis. Determining a thickness of the film in a plane defined by the Z-axis and the X-axis is based at least in part a difference between the footprint of the geometric shape of the film in the plane defined by the X-axis and the Y-axis; and the footprint of the geometric shape of the geometric feature in the plane defined by the X-axis and the Y-axis.

Embodiments of the invention are directed to a multi-layered IC that includes an IC layer having an inactive region and an active region. The active region includes an active device. The inactive region includes an inactive feature including a geometric feature having a geometric shape that extends along an X-axis, a Y-axis, and a Z-axis. A film is over the active device and the geometric feature. A first portion of the film is part of the active device. A second portion of the film is over the geometric feature such that a geometric shape of the film matches the geometric shape of the geometric feature. A footprint of the geometric shape of the film in the plane defined by the X-axis and the Y-axis is different from a footprint of the geometric shape of the geometric feature in the plane defined by the X-axis and the Y-axis. A thickness of the film in a plane defined by the Z-axis and the X-axis includes a difference between the footprint of the geometric shape of the film in the plane defined by the X-axis and the Y-axis the footprint of the geometric shape of the geometric feature in the plane defined by the X-axis and the Y-axis.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 7 depicts various implementations of an equation that can be utilized by the systems illustrated in FIG. 2 in accordance with some embodiments of the invention;

FIG. 11A depicts a block diagram illustrating top-down views of an angled geometric feature before and after film deposition in accordance with embodiments of the invention;

Figure 1:
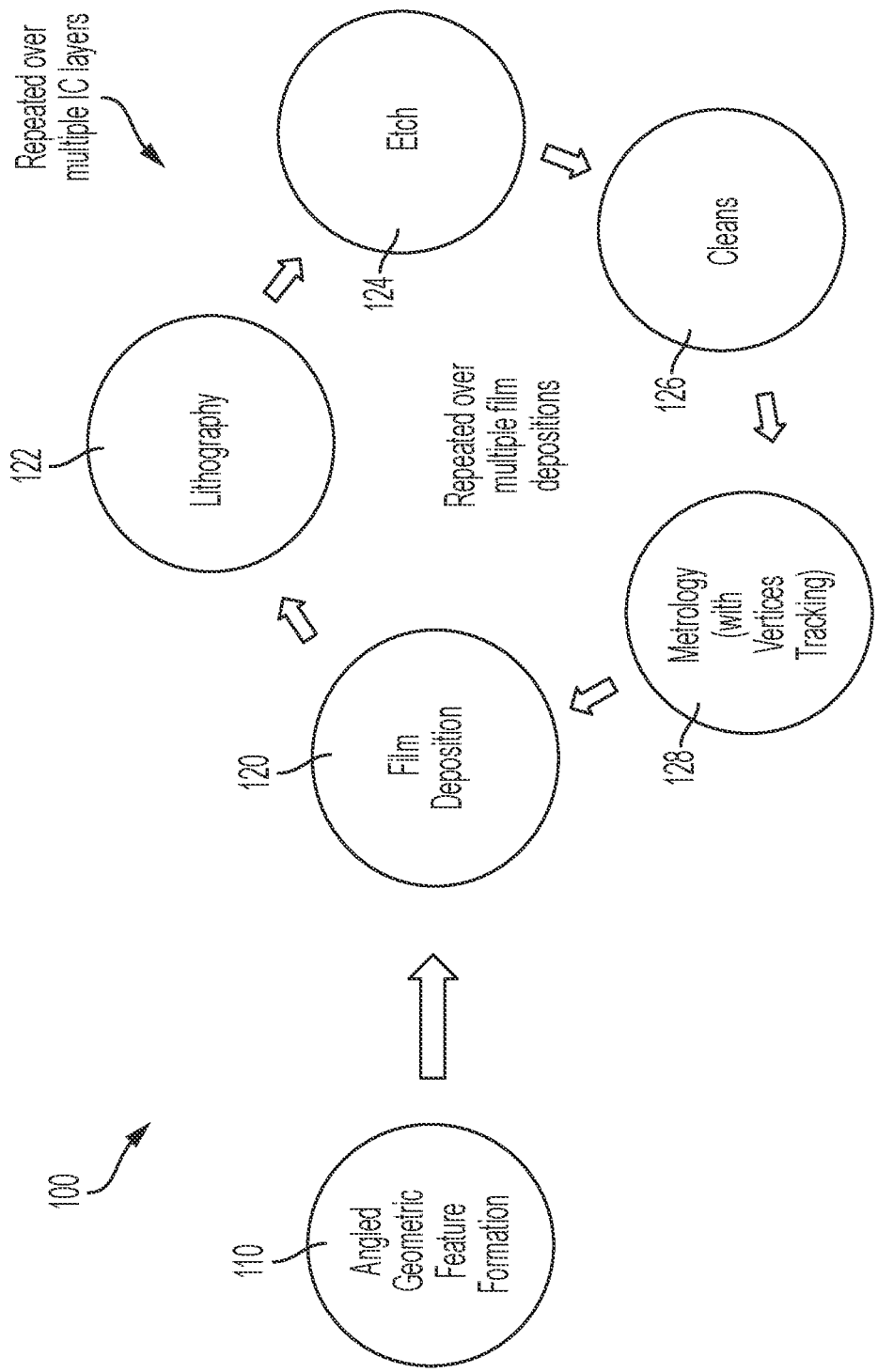
FIG. 1 depicts a high-level flow diagram illustrating a methodology in accordance with embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention. Thin film deposition is the process of creating and depositing a thin layer of material (e.g., from a few nanometers to about 100 microns thick) onto various layers of an IC wafer during fabrication. In addition to IC wafer fabrication, thin film deposition is also used for other technologies that require layers in the nanometer to micron range (e.g., coating automobile parts with chromium films). In general, thin film deposition processes are divided into two categories chemical vapor deposition (CVD) and physical vapor deposition (PVD). CVD includes the introduction of a volatile precursor agent to produce a chemical reaction that results in a thin layer being deposited on a deposition surface. PVD includes various mechanical, electromechanical, and thermodynamic processes in which the to-be-deposited material is physically released from a target material and deposited onto the deposition surface.

Thin films are conventionally deposited onto a layer of an IC wafer to introduce new properties and/or change the existing properties of the various devices and functional elements being formed on the IC wafer layer. For example, thin films can be deposited onto conductors and insulators to change the electrical properties of the conductor and/or insulator. Because thin a film's thickness is fundamentally related to the above-described properties, IC fabrication operations incorporate inline metrology systems and techniques that measure, regulate, and control the thickness of deposited thin films.

Known thin film measurement techniques rely heavily on broadband spectroscopic ellipsometry, which is implemented using various types of ellipsometer equipment. In general, an ellipsometer uses optical techniques to characterize the thickness (depth) of thin films. By measuring a change in polarization as light is reflected from a thin film, an ellipsometer can computer a film's thickness by comparing the change in polarization to a model. In general, metrology equipment that determines thin layer thickness by measuring complex optical and thermal characteristics of a thin film layer are extremely complicated to operate and maintain in that they require calibrating complex systems to output specialized waves, as well as calculating film thickness based on complicated outputs such as phase shifts comparisons.

Turning now to an overview of aspects of the invention, embodiments of the invention address the shortcoming of known inline thin film measurement techniques by providing fabrication methods, fabrication systems, and resulting structures configured and arranged to determine the thickness of a conformally deposited film using angled geometric features and vertices tracking. In accordance with embodiments of the present invention, a new fabrication technique is leveraged whereby one or more geometric features (and/or shapes) are patterned on an IC wafer layer to assist with the layer thickness measurements. The one or more geometric shapes have sides that either extend inward into the IC wafer layer's surface or protrude away from the IC wafer layer's surface. A material is deposited directly on the semiconductor layer's surface to form a thin film layer. The thickness of the deposited thin film layer is computed by measuring a thickness of the material accumulated against the sides of the geometric shapes. The thickness of the material accumulated against the side of a geometric shape corresponds to the thickness of the deposited thin film layer. Advantageously, the geometric shapes enable the provide fabrication and measurement techniques that ensure accurate measurement of the thickness of the deposited thin film layer deposited on a surface of an IC wafer layer.

Fabricating the geometric shapes on an IC wafer layer's surface also permits the measurement of the deposited thin film layer without measuring the layer's optical characteristics. The measurement techniques described herein provide a straightforward structure and method to calculate the thickness of the deposited thin film layer that can be repeated on a given layer, and that can also be repeated for each subsequent IC wafer layer until the IC wafer is fabricated.

Fabricating geometric shapes on a semiconductor layer's surface, according to one or more embodiments of the present invention, offers technical benefits over conventional layer thickness measuring techniques that are observable during the fabrication process. For example, measuring the material accumulated on the sides of the disclosed geometric shapes enables an accurate measurement of top-down changes to an IC wafer layer during the fabrication process (i.e., "inline") without complicated optical illumination methods such as spectroscopic ellipsometry.

Turning now to a more detailed description of embodiments of the invention, FIG. 1 depicts a high-level flow diagram illustrating a methodology 100 in accordance with embodiments of the invention. The methodology 100 can be performed using the system 200 (shown in FIG. 2). The methodology 100 begins at block 110 by forming one or more angled geometric features, such as the angled geometric features 412, 432 shown in FIG. 4; the angled geometric features 512, 532 shown in FIG. 5; the angled geometric feature 612 shown in FIG. 6A; and the angled geometric feature 632 shown in FIG. 6B. In accordance with aspects of the invention, the angled geometric features formed at block 110 are created with known or measured dimensions prior to further processing to enable the various comparison techniques described herein.

Figure 3:
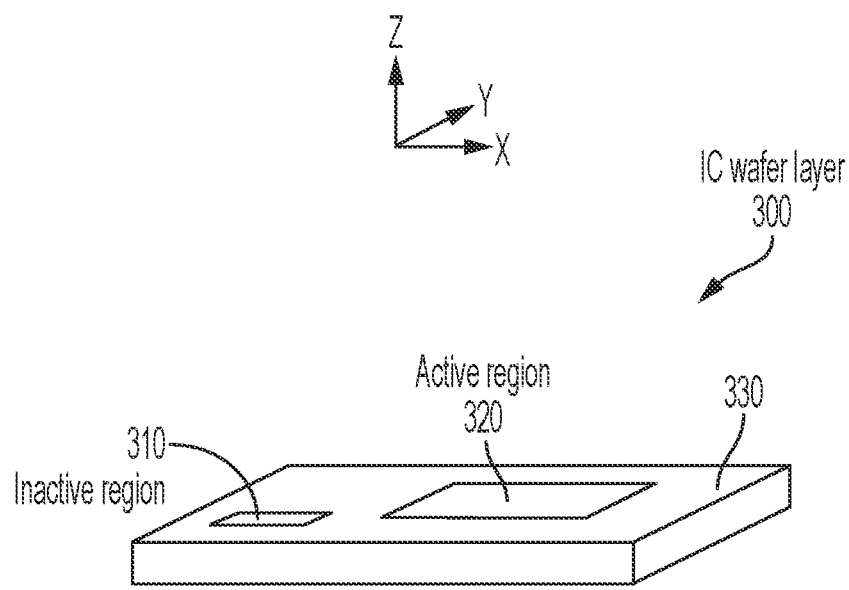
FIG. 3 depicts a block diagram illustrating a layer of an integrated circuit (IC) wafer in accordance with embodiments of the invention.

In accordance with some embodiments of the invention, one or more of the angled geometric features 412, 432, 512, 532, 612, 632 can be formed in or on an inactive region 310 (shown in FIG. 3) of an IC wafer layer 300 (shown in FIG. 3). At block 120, any suitable film deposition process is used to conformally deposit a film 802 (shown in FIGS. 8 and 10A-11D) over the IC wafer layer 300 such that it covers features formed in the inactive region 310 and the features formed in the active region 320 (shown in FIG. 3) of the IC wafer layer 300. In some embodiments of the invention, the film 802 is a thin film. The film 802 can be formed from a variety of types of materials that can be conformally deposited, and that can perform a variety of functions in connection with the post-fabrication operation of the active features in the active region 320 of the IC wafer layer 300. The features formed in the active region 320 can include, for example, "active" features such as transistors, resistors, capacitors, memory elements, conductive wiring (or interconnects), stabilizing dielectrics, and the like. In accordance with aspects of the invention, the features formed in the active region 320 that are covered by the film 802 can include at least one device-under-fabrication. For example, the device-under-fabrication can be a transistor that is currently being fabricated, and the film 802 can be a gate dielectric layer of the transistor that is deposited as a part of fabricating the transistor's gate. In accordance with embodiments of the invention, the active features in the active region 320 of the IC wafer layer 300 are "active" in that they perform (or will perform, post-fabrication) a variety of functions in connection with the post-fabrication operation of the active features in the active region 320 of the IC wafer layer 300. The features formed in the inactive region 310 include, for example, "inactive" features such as one or more of the angled geometric features 412, 432, 512, 532, 612, 632. Unlike the portion of the film 802 deposited over the active region 320, the portion of the film 802 deposited over the inactive features in the inactive region 310 performs the function of enabling inline metrology operations (e.g., block 128 of the methodology 100) that determine the actual thickness of the deposited film 802 in accordance with aspects of the invention. Additionally, unlike the active features in the active region 320, the inactive features in the inactive region 310 are completed and not under-fabrication when the film 802 is deposited. Further, unlike the active features in the active region 320, the inactive features in the inactive region 310 of the IC wafer layer 300 are "inactive" in that they do not perform functions in connection with the post-fabrication operation of the active features in the active region 320 of the IC wafer layer 300

At blocks 122, 124, 126 of the methodology 100, optional post-deposition film processing operations can be performed. In the example methodology 100, the optional post-deposition film processing operations include lithography operations performed at block 122, etching operations performed at block 124, and cleaning operations performed at block 126. The optional post-deposition film processing operations at block 122, 124, 126 are simplified, non-limiting examples. In practice, the specific post-deposition film processing operations, if required, will be tailored to the functional requirements and material of the film 802 (shown in FIGS. 8 and 10A-11D) as dictated by the "active" features (e.g., transistors, resistors, capacitors, memory elements, conductive wiring (or interconnects), stabilizing dielectrics, and the like) in the active region 320 (shown in FIG. 3) of the IC wafer layer 300 (shown in FIG. 3). In accordance with aspects of the invention, the simplest illustrative example of the methodology 100 can be limited to blocks 110, 120, 128 without the post-deposition processing operations at blocks 122, 124, 126. All descriptions of the methodology 100 provided herein apply to the methodology 100 with and/or without post-deposition processing operations.

Figure 4:
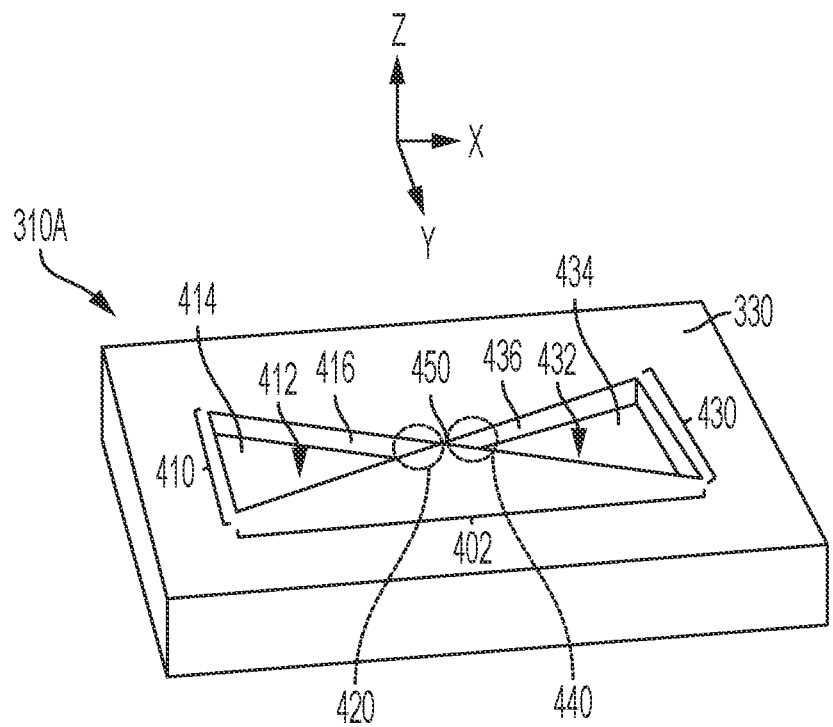
FIG. 4 depicts a block diagram illustrating an angled geometric feature in accordance with embodiments of the invention.
Figure 5:
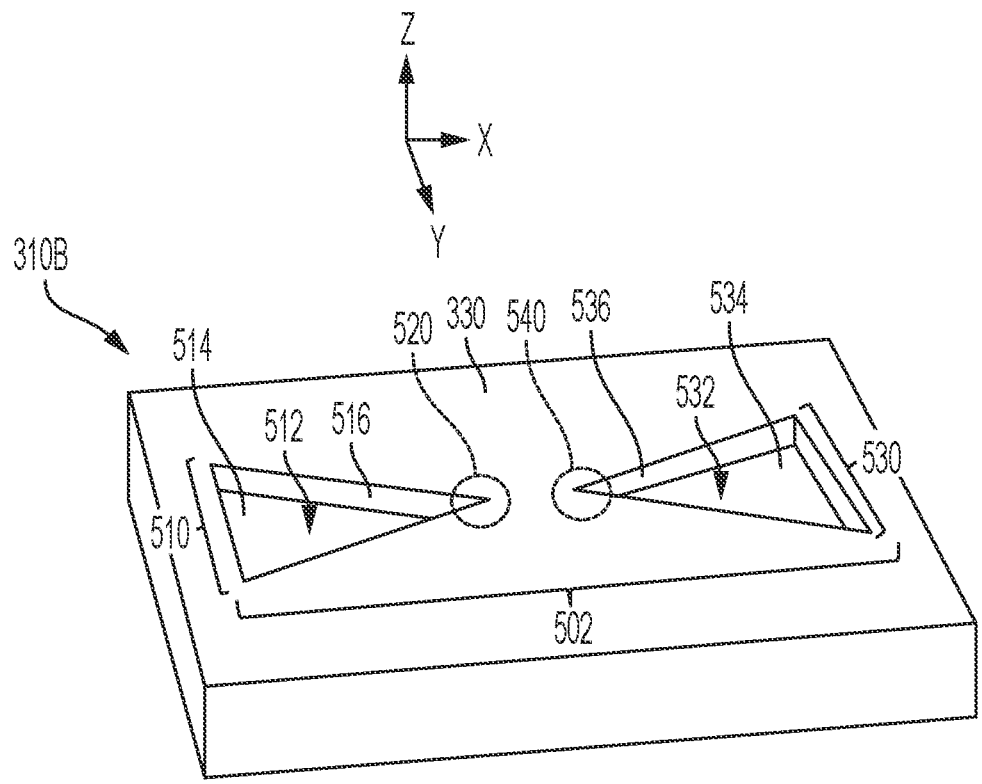
FIG. 5 depicts a block diagram illustrating an angled geometric feature in accordance with embodiments of the invention.
Figure 6A:
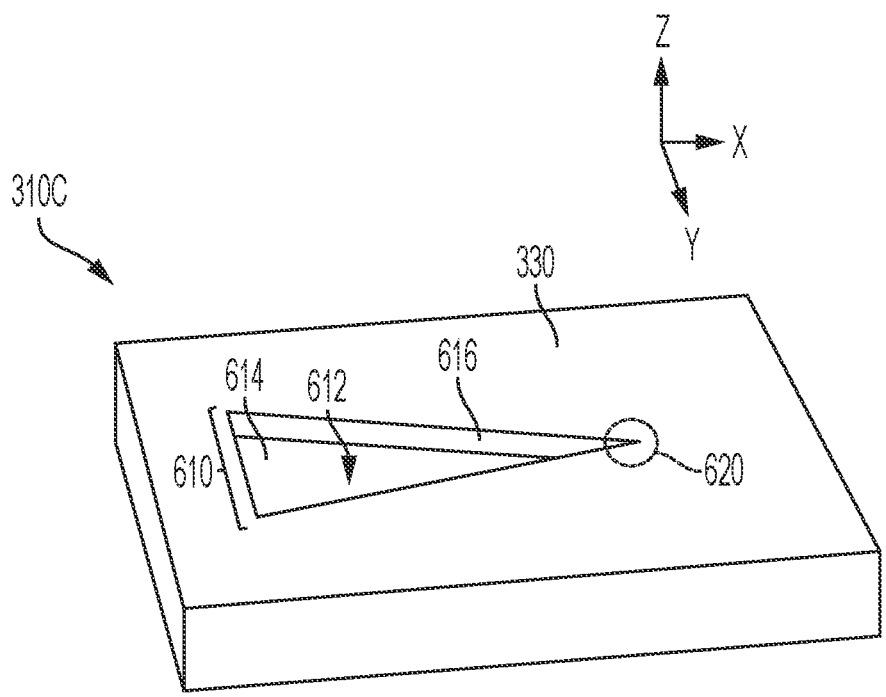
FIG. 6A depicts a block diagram illustrating an angled geometric feature in accordance with embodiments of the invention.
Figure 6B:
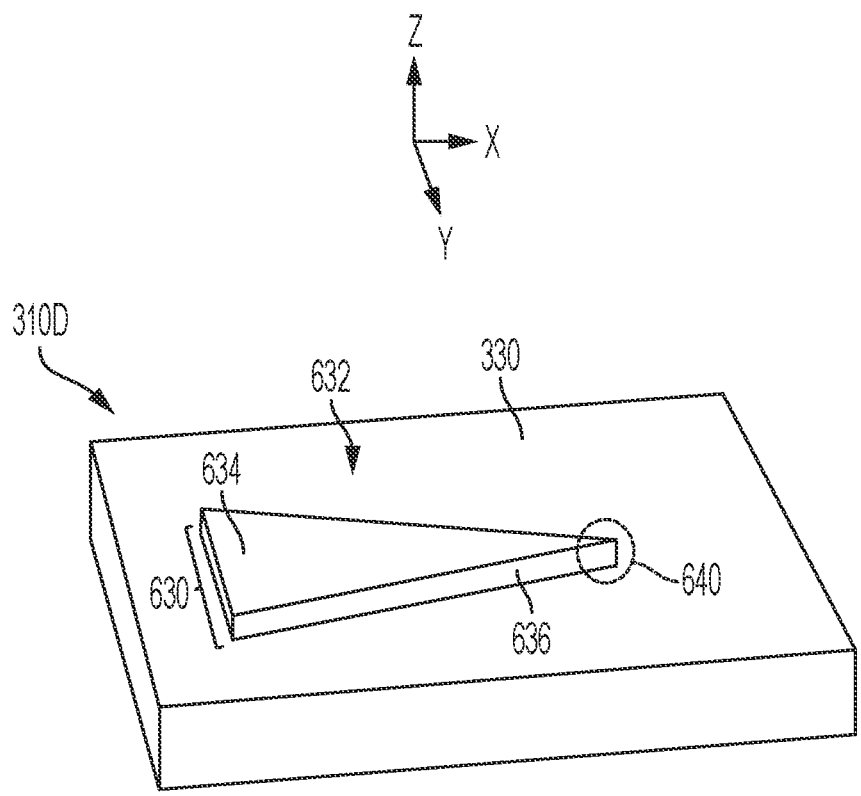
FIG. 6B depicts a block diagram illustrating an angled geometric feature in accordance with embodiments of the invention.

At block 128, metrology operations are performed on the angled geometric features 412, 432 shown in FIG. 4; the angled geometric features 512, 532 shown in FIG. 5; the angled geometric feature 612 shown in FIG. 6A; and the angled geometric feature 632 shown in FIG. 6B. At this stage of the methodology 100, the same film 802 (shown in FIGS. 8 and 10A-11D) has been deposited over the "active" features in the active region 320 (shown in FIG. 3) and the "inactive" features in the inactive region 310 (shown in FIG. 3). Accordingly, the thickness of the film 802 deposited over the active region 320 of the IC wafer layer 300 can be determined by determining the thickness of the film 802 deposited over the inactive region 310 of the IC wafer layer 300.

In embodiments of the invention, the metrology operations at block 128 apply a novel and simplified analysis to the angled geometric features 412, 432, 512, 532, 612, 632 that leverages the angled geometric shape of the angled geometric features 412, 432, 512, 532, 612, 632, as well as the predictable relationships between the angled geometric shapes, to determine or "solve for" the unknown thickness of the film 802. In some embodiments of the invention, linear two-dimensional (2D) measurements (e.g., 2D shown in FIG. 8) of the angled geometric features 412, 432, 512, 532, 612, 632 are also used to determine or "solve for" the unknown thickness of the film 802. In embodiments of the invention, the metrology operations at block 128 "track" the top-down, two-dimensional (2D) changes to the angled, geometric shape of the angled geometric feature from their formation at block 110 to the film deposition at block 120. The top-down, 2D changes to an angled, geometric shape of an angled geometric feature from its formation at block 110 to the film deposition at block 120 include relative (i.e., pre-film-deposition and post-film-deposition) positions of sidewalls and angles of the particular angled geometric feature 412, 432, 512, 532, 612, 632. In embodiments of the invention, the angled geometric feature 412, 432, 512, 532, 612, 632 includes a triangular geometric shape having at least one vertex, and the angle that is tracked from pre-film-deposition to post-film-deposition is the triangle's vertex. Accordingly, in block 128 and throughout this detailed description, the metrology operations in accordance with aspects of the invention are described as including novel "vertices tracking," which is a general reference to operations that use differences between the pre-film-deposition position and the post-film-deposition position of sidewalls and angles (i.e., vertices) of an angled geometric feature in order to determine or "solve for" an unknown thickness of a film deposited on the angled geometric feature.

Additional details of the angled geometric features formed at block 110 and the metrology operations (with vertices tracking) performed at block 128 are depicted at FIGS. 4-13 and described in greater detail subsequently herein.

In accordance with aspects of the invention, multiple iterations of blocks 120, 122, 124, 126, 128 can be applied to a single iteration of the angled geometric feature formation operations at block 110, which means that multiple films 802 (shown in FIGS. 8 and 10A-11D) can be deposited the over the angled geometric feature(s) formed at block 110 for a single IC wafer layer 300 (shown in FIG. 3), and block 128 can be configured to determine a thickness dimension for each individual deposited film 802. For example, a first instance of the film 802 can be deposited during a first iteration of the operations at blocks 120, 122, 124, 126, and a thickness of the first instance of the film 802 can be determined at block 128. While at the same IC wafer layer 300, a second instance of the film 802 can be deposited during a second iteration of the operations at blocks 120, 122, 124, 126, and a thickness of the first instance of the film 802 plus a thickness of the second instance of the film 802 can be determined at block 128. Because the determined thickness of the first instance of the film 802 has been stored (e.g., using the controller 220 of the system 200 shown in FIG. 2), block 128 can determine the thickness of the second instance of the film 802 by subtracting the thickness of the first instance of the film from the thickness determined during the second iteration of the operations at blocks 120, 122, 124, 126.

In accordance with aspects of the invention, the methodology 100 can be applied over multiple layers of an IC wafer. For example, the methodology 100 can be applied over multiple instances of the IC wafer layer 300 (shown in FIG. 3).

Figure 2:
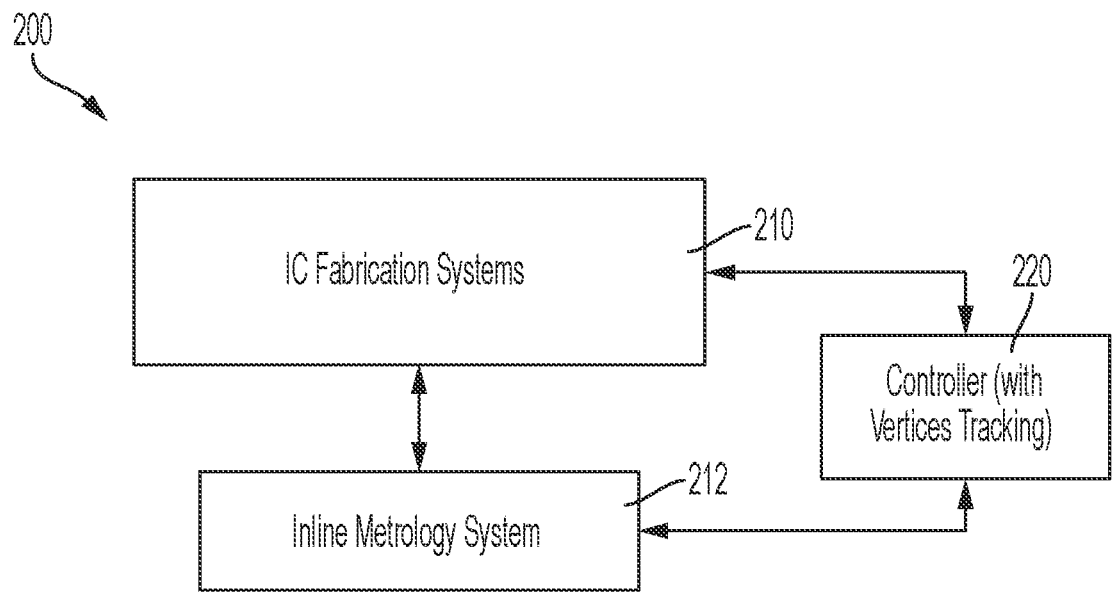
FIG. 2 depicts a block diagram illustrating a system in accordance with embodiments of the invention.

FIG. 2 depicts a block diagram illustrating details of the system 200, which can be used to implement the methodology 100 (shown in FIG. 1) in accordance with embodiments of the invention. The system 200 includes an IC fabrication system 210 in wired or wireless electrical communication with an inline metrology system 212. The system 200 further includes a controller (with vertices tracking) 220 in wired or wireless electrical communication with the IC fabrication systems 210 and the inline metrology system 212.

In accordance with aspects of the invention, the IC fabrication systems 210 can include any suitable configuration of fabrication systems used to fabricate an IC wafer. A non-limiting example implementation of the IC fabrication systems 210 is the semiconductor fabrication systems 1400 depicted in FIG. 14 and described in greater detail subsequently herein.

In accordance with aspects of the invention, the inline metrology system 212 can be implemented using any suitable metrology instrument/system configured and arranged to perform wafer and thin film in-line inspection after semiconductor processing. Because semiconductor fabrication follows very strict standards and must accommodate very small dimensions, robust quality control (QC) procedures and semiconductor inspection process requirements have resulted in the development of high-precision semiconductor metrology instruments. Many of these devices and systems use a combination of laser, optical, and electron beam technologies. The inline metrology system 112 is described as "inline" because it has the ability to measure each wafer immediately before and after the processing is performed, which enables the inline metrology system 212 to measure and adjust the process recipe performed by the IC fabrication systems 210 during IC fabrication. In some embodiments of the invention, the inline metrology system 212 can include a critical-dimension scanning electron microscope (CD-SEM), which can be used to perform linear measurements such as the measurement "2D" depicted in FIG. 8.

In accordance with embodiments of the invention, the controller (with vertices tracking) 220 is used to control the IC fabrication system 210 and the inline metrology system 212 to perform the metrology operations depicted at block 128 of the methodology 100 (shown in FIG. 1), as well as the various operations depicted at FIGS. 7-9, 13, and 14 and described in greater detail subsequently herein. In embodiments of the invention, the controller (with vertices tracking) 220 can be implemented using the programmable computing system 1500 (shown in FIG. 15).

FIG. 3 depicts a simplified block diagram illustrating the IC wafer layer 300 of a multi-layered IC wafer (not shown separately). The multi-layered IC wafer is fabricated in a series of stages, including a front-end-of-line (FEOL) stage, a middle-of-line (MOL) stage and a back-end-of-line (BEOL) stage. The process flows for fabricating IC wafers are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that communicatively couple to active regions (e.g., gate, source, and drain) of the device element. BEOL layers use insulating and stabilizing dielectric materials embedded with a network of wires, lines and vias that couple current to FEOL and MOL layers to complete the IC. BEOL layers can also include embedded MRAM formed from memory structures such as MTJ stacks. Most ICs need more than one layer of wires/lines to form all the necessary connections, and as many as 5-12 layers are added in the BEOL process. In accordance with embodiments of the invention, the IC wafer layer 300 can be any one of the above-described IC layers or levels.

The IC wafer layer 300 includes a top surface 330 having an inactive region 310 and an active region 320. In embodiments of the invention, the active region 320 can include any of the above-described elements formed in the FEOL, MOL, and BEOL fabrication stages. In embodiments of the invention, the inactive region can include any one or more of the angled geometric features 412, 432 shown in FIG. 4; the angled geometric features 512, 532 shown in FIG. 5; the angled geometric feature 612 shown in FIG. 6A; and the angled geometric feature 632 shown in FIG. 6B. For ease of illustration and explanation, one inactive region 310 and one active region 320 are depicted in FIG. 3, however, it is understood that any number of inactive regions 310 and active regions 320 can be provided. In some embodiments of the invention, the inactive regions 310 can be selectively positioned relatively close to selected sections of the active regions 320.

FIG. 4 depicts a three-dimensional (3D) block diagram illustrating an example of how the inactive region 310 (shown in FIG. 3) can be implemented as an inactive region 310A having a top surface 330 in which an angled geometric feature 412, 432 has been formed in accordance with embodiments of the invention. In the 3D block diagram depicted in FIG. 4, the film 802 (shown in FIGS. 8 and 10A-11D) has not yet been deposited over the inactive region 310A. The angled geometric features 412, 432 include a first angled geometric feature in the form of a cavity 412 having a triangular shape 410, sidewalls 416, a bottom surface 414, and a vertex 420, configured and arranged as shown. The angled geometric features 412, 432 further include a second angled geometric feature in the form of a cavity 432 having a triangular shape 430, sidewalls 436, a bottom surface 434, and a vertex 440, configured and arranged as shown. In accordance with aspects of the invention, the vertices 420, 440 meet or merge at a location 450. In embodiment of the invention, the sidewalls 416 are substantially perpendicular with respect to the bottom surface 414; and the sidewalls 436 are substantially perpendicular with respect to the bottom surface 434. Because of the combined triangular shapes 410, 430, the shape of the overall angled geometric feature 412, 432 is described herein as a bow-tie shape 402. In embodiments of the invention, the triangular shape 410 is substantially the same shape as the triangular shape 430. In embodiments of the invention, the triangular shape 410 is substantially the same shape and size (or footprint) as the triangular shape 430.

FIG. 5 depicts a 3D block diagram illustrating an example of how the inactive region 310 (shown in FIG. 3) can be implemented as an inactive region 310B having a top surface 330 in which angled geometric features 512, 532 have been formed in accordance with embodiments of the invention. In the 3D block diagram depicted in FIG. 5, the film 802 (shown in FIGS. 8 and 10A-11D) has not yet been deposited over the inactive region 310B. The angled geometric features 512, 532 includes a first angled geometric feature in the form of a cavity 512 having a triangular shape 510, sidewalls 516, a bottom surface 514, and a vertex 520, configured and arranged as shown. The angled geometric features 512, 532 includes a second angled geometric feature in the form of a cavity 532 having a triangular shape 530, sidewalls 536, a bottom surface 534, and a vertex 540, configured and arranged as shown. In accordance with aspects of the invention, the vertices 520, 540 are separated from one another, and the cavities 512, 532 are mirror images of one another. In embodiment of the invention, the sidewalls 516 are substantially perpendicular with respect to the bottom surface 514; and the sidewalls 536 are substantially perpendicular with respect to the bottom surface 534. Because the triangular shapes 510, 530 of the cavities 512, 532 are mirror images of one another, the shape of the overall angled geometric features 512, 532 is described herein as a mirrored separated vertex shape 502. In embodiments of the invention, the triangular shape 510 is substantially the same shape as the triangular shape 530. In embodiments of the invention, the triangular shape 510 is substantially the same shape and size (or footprint) as the triangular shape 530.

FIG. 6A depicts a 3D block diagram illustrating an example how the inactive region 310 (shown in FIG. 3) can be implemented as an inactive region 310C having a top surface 330 in which an angled geometric feature 512 has been formed in accordance with embodiments of the invention. In the 3D block diagram depicted in FIG. 6A, the film 802 (shown in FIGS. 8 and 10A-11D) has not yet been deposited over the inactive region 310C. The angled geometric feature 612 is a cavity having a triangular shape 610, sidewalls 616, a bottom surface 614, and a vertex 620, configured and arranged as shown. In embodiment of the invention, the sidewalls 616 are substantially perpendicular with respect to the bottom surface 614. The triangular shape 610 of the angled geometric feature/cavity 612 is also described herein as a non-mirrored cavity or a non-mirrored cavity shape.

FIG. 6B depicts a 3D block diagram illustrating an example how the inactive region 310 (shown in FIG. 3) can be implemented as an inactive region 310D having a top surface 330 in which an angled geometric feature 632 has been formed in accordance with embodiments of the invention. In the 3D block diagram depicted in FIG. 6B, the film 802 (shown in FIGS. 8 and 10A-11D) has not yet been deposited over the inactive region 310D. The angled geometric feature 632 is a protrusion 632 having a triangular shape 630, sidewalls 636, a top surface 634, and a vertex 620, configured and arranged as shown. In embodiment of the invention, the sidewalls 636 are substantially perpendicular with respect to the top surface 634. The triangular shape 630 of the angled geometric feature/protrusion 632 is also described herein as a non-mirrored protrusion or a non-mirrored protrusion shape.

Known fabrication methods can be used to form the angled geometric features 412, 432 shown in FIG. 4; the angled geometric features 512, 532 shown in FIG. 5; the angled geometric feature 612 shown in FIG. 6A; and the angled geometric feature 632 shown in FIG. 6B. For example, the relevant inactive region 310A, 310B, 310C, 310D can be patterned to define a footprint of each angled geometric feature 412, 432, 512, 532, 612, 632, and any suitable process, such as, for example, a wet etch, a dry etch, or a combination of sequential wet and/or dry etches and be used to form the relevant 3D angled geometric feature 412, 432, 512, 532, 612, 632 in the corresponding inactive region 310A, 310B, 310C, 310D.

FIG. 7 depicts multiple implementations of an equation (shown as Equation-A1, Equation-A2, Equation-A3, Equation-A4) that can be utilized by the system 200 (shown in FIG. 2) to perform metrology operations with vertices tracking in accordance with aspects of the invention. Although the actual equation does not change, the implementation of the equation changes based on the relevant angled geometric feature 412, 432, 512, 532, 612, 632 to which the equation will be applied. Accordingly, the different implementations of the equation are identified in FIG. 7 as Equation-A1, Equation-A2, Equation-A3, Equation-A4. In accordance with some embodiments of the invention, the novel "vertices tracking" is a general reference to operations that use pre-film-deposition and post-film-deposition positions of sidewalls and angles (i.e., vertices) of an angled geometric feature to determine or "solve for" and unknown thickness of a film deposited on the angled geometric feature. In accordance with aspects of the invention, Equation-A1 can be used to determine or "solve for" an unknown thickness of a film 802 (shown in FIGS. 8 and 10A-11D) deposited over the angled geometric feature 412, 432 (shown in FIG. 4); Equation-A2 can be used to determine or "solve for" an unknown thickness of a film 802 deposited over the angled geometric feature 512, 532 (shown in FIG. 5); Equation-A3 can be used to determine or "solve for" an unknown thickness of a film 802 deposited over the angled geometric feature 612 (shown in FIG. 6A); and Equation-A4 can be used to determine or "solve for" an unknown thickness of a film 802 deposited over the angled geometric feature 632 (shown in FIG. 6B). In general, singularity, separation or mirroring of the relevant angled geometric feature(s) 412, 432, 512, 532, 612, 632 does not change the trigonometric definition of $T_{thickness}$. What changes is the top down or "2D" measurement that is collected to determine "D" based on a designed\chosen alpha ($\alpha$) for the solution of $T_{thickness}$. The determination of this observed sidewall thickness on features 416, 436 (shown in FIG. 4), 516, 536 (shown in FIG. 5), 616 (shown in FIG. 6A), and 636 (shown in FIG. 6B) can also inform a user of the planar or horizontal surface thickness of the film 802 based on known film deposition behavior. As an example, if the nature of the film 802 is known to be perfectly conformal, and if the horizontal surface deposition rate matches vertical surface deposition rate, the measured and calculated sidewall thickness will match the planar or field thickness. Alternately if the film 802 is known to have a 50% depressed vertical or sidewall deposition rate compared to horizontal surfaces, the calculated thickness would be adjusted by that factor to determine the horizontal film thickness. In this manner both symmetrically conformal and non-symmetrically conformal film thicknesses can be monitored using the equations shown in FIG. 7 by taking into account the sidewall deposition rate of the film 802. Additional discussion of Equation-A1, Equation-A2, Equation-A3, and Equation-A4 are provided subsequently herein in connection with the description of FIGS. 8-11D.

Figure 8:
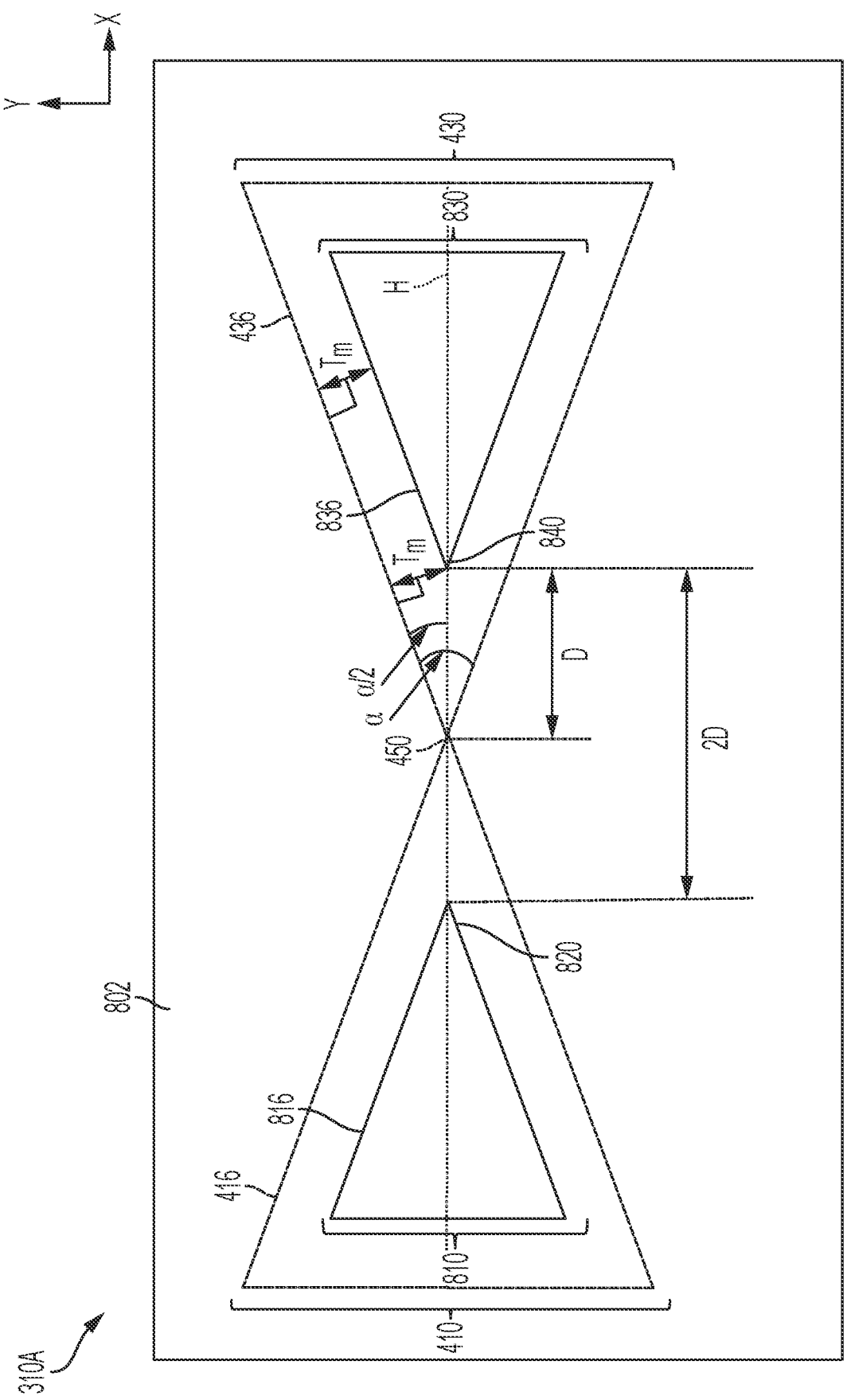
FIG. 8 depicts a block diagram illustrating a top-down view of an angled geometric feature after film deposition in accordance with embodiments of the invention.

FIG. 8 depicts a block diagram illustrating a top-down view of the inactive region 310A (also shown in 3D in FIG. 4) after the film 802 has been conformally deposited over the inactive region 310A and the active region 320 (shown in FIG. 3) of the IC wafer layer 300 (shown in FIG. 3). In embodiments of the invention, the film 802 can be deposited using any suitable deposition process, including but not limited to CVD, plasma enhanced chemical vapor deposition (PECVD), atomic layer deposition (ALD), flowable CVD, spin-on dielectrics, and/or physical vapor deposition (PVD). As depicted in FIG. 8, the film 802 has covered the top surface 330 (shown in FIG. 4), the sidewalls 416, 436 (shown in FIG. 4), and the bottom surface 414, 434 (shown in FIG. 4), thereby forming a first new cavity 810 having first new sidewalls 816 and a first new vertex 820, along with forming a second new cavity 830 having second new sidewalls 836 and a second new vertex 840. For reference, the triangular shape 410 of the cavity 412, the sidewalls 416, the triangular shape 430 of the cavity 432, the sidewalls 436, and the location 450 are depicted as dotted lines to show their locations under the conformally deposited film 802. As shown in FIG. 8, the shape of the new cavity 810 tracks or matches the triangular shape 410 but has a smaller footprint that is positioned inside the triangular shape 410. Similarly, the new cavity 830 tracks or matches the triangular shape 430 but has a smaller footprint that is positioned inside the triangular shape 430.

Referring now to the 3D view of the inactive region 310A shown in FIG. 4, Equation-A1 shown in FIG. 7, and the top-down view of the inactive region 310A show in FIG. 8, an example of how the metrology (with vertices tracking) operations at block 128 (shown in FIG. 1) of the methodology 100 (shown in FIG. 1) can be performed in accordance with embodiments of the invention will now be described. By selecting the geometric shape (e.g., triangular) of the angled geometric features 412, 432 (shown in FIG. 4), and by depositing the film 802 over the angled geometric features 412, 432, the new cavities 810, 830 match or have substantially the same geometric shape as the angled geometric features 412, 432, and also have a geometric relationship with the angled geometric features 412, 432. More specifically, the distance (shown in FIG. 8 as $T_m$) between, for example, the sidewall 436 of the angled geometric feature 432 and the sidewall 836 of the new cavity 830 can be determined using Equation-A1, where $T_m$ is $T_{thickness}$. The system 200 (shown in FIG. 2) performs analysis to identify the variables in Equation-A1 such that the only unknown is $T_{thickness}$ (or $T_m$), and the thickness of the conformally deposited film 802 layer in the Z/X axes plane is the same as $T_{thickness}$ (or $T_m$) in the X/Y axes plane.

In accordance with aspects of the invention, the vertex 440 (show in FIG. 4) has an angle $\alpha$. Angle $\alpha$ is available because it was is determined during the design and fabrication of the angled geometric features 412, 432 (shown in FIG. 4). For example, the angle $\alpha$ can be retrieved by the controller 220 (shown in FIG. 2) from the IC design for the IC wafer layer 300 (shown in FIG. 3). A hypotenuse (H) is identified by identifying a line (shown as a dotted line) extending through the second new cavity 830, the vertex 840, the merged location 450, the vertex 820 and the first new cavity 810. A length 2D extending along a portion of the hypotenuse H and extending between the vertex 840 and the vertex 820 can be determined using, for example, the inline metrology system 212 (shown in FIG. 2), which, in some embodiments of the invention can be a CD-SEM. A length D along a portion of the hypotenuse H extending from the vertex 840 to the merged location 450 can be computed by dividing the length 2D by two (2). With a and D determined, $T_{thickness}$ (or $T_m$) can be computed using Equation-A1.

Figure 9:
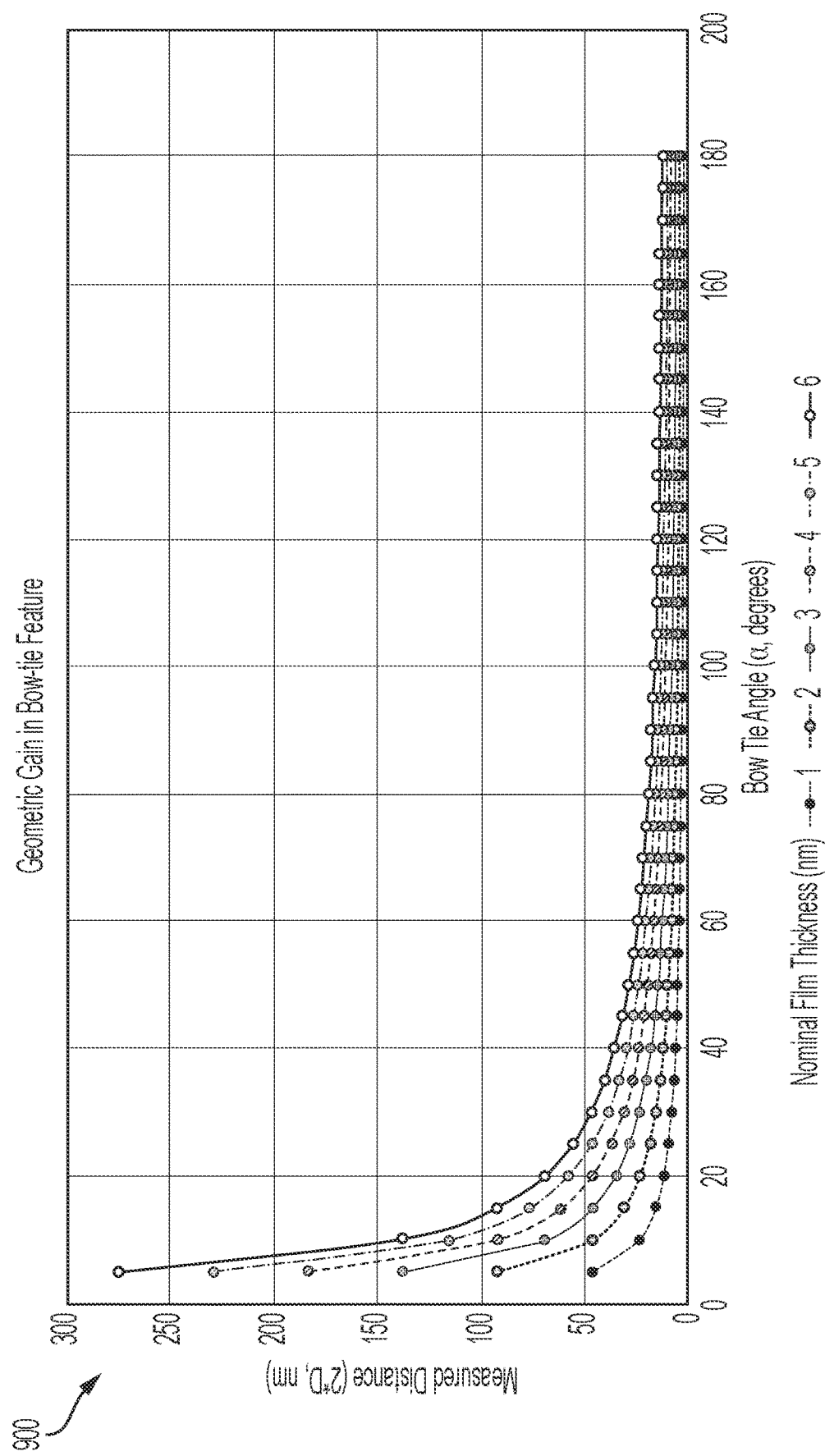
FIG. 9 depicts a graph illustrating how angle dimensions of the angled geometric features shown in FIGS. 4 and 8 can be configured to improve measurement sensitivity for selected film thicknesses.

FIG. 9 depicts a graph 900 that illustrates how angle dimensions of the angled geometric features 412, 432 shown in FIGS. 4 and 8 can be configured to improve measurement sensitivity (or "gain") for selected film thicknesses. The ability to identify relatively small differences in film thickness can be accentuated through use of the angled geometric feature 412, 432, 512, 532, 612, 632. In accordance with aspects of the invention, the angle of the angled geometric feature 412, 432, 512, 532, 612, 632 can be varied to provide more measurement sensitivity for a particular film thickness. In embodiments of the invention, multiple implementations of the angled geometric features 412, 432, 512, 532, 612, 632 with different angles can be measured to provide better fitting and accuracy for film thickness measurements by fitting to the predicted curve shown in the graph 900. Through application of the mathematic properties of the SIN function used in solving for $T_{thickness}$ as a function of D as measured by changes from the initial formation, or 2D, or 2D+S, the sharper (or lower in angular magnitude) the angle chosen the larger the change in D, or 2D or 2D+S that will be observable for a given conformal film 802. Selection of the starting angle alpha (α) based on the expected film thickness, or creation of a plurality of angled geometric feature 412, 432, 512, 532, 612, 632 with varying angles alpha (α) will enable mathematical multiplication of the sidewall intersections and resulting observable vertex all of which will result in a more robust measurement result using the metrology operations 120 of the methodology 100 (shown in FIG. 1).

Figure 10A:
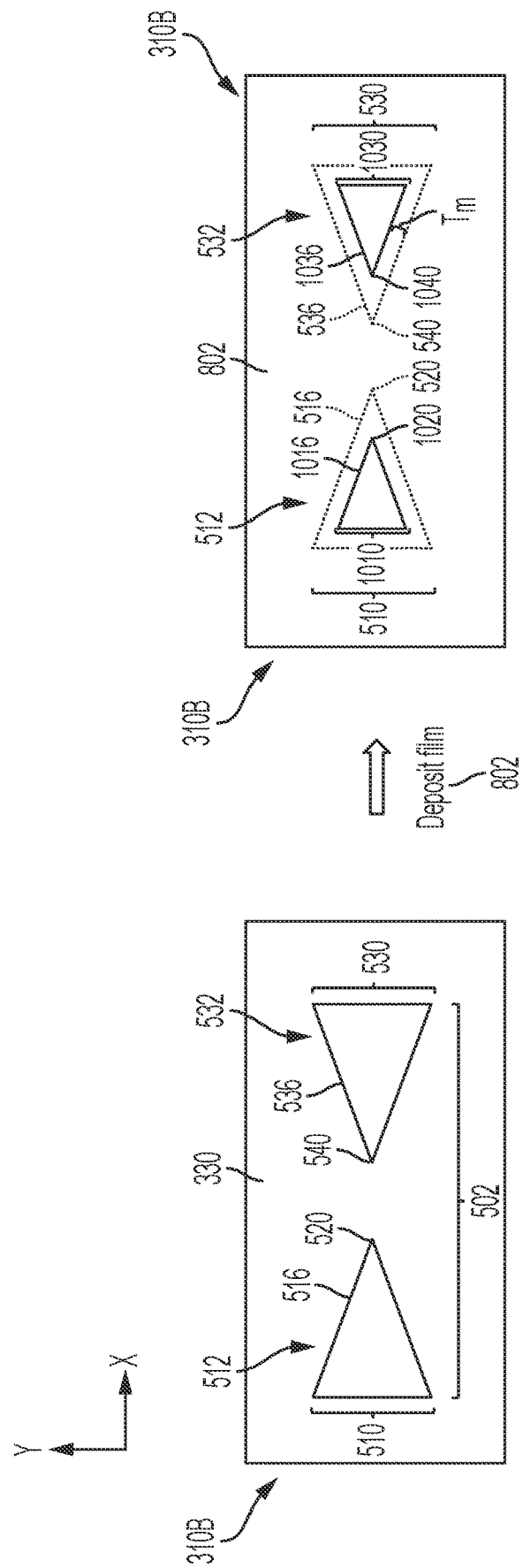
FIG. 10A depicts a block diagram illustrating top-down views of an angled geometric feature before and after film deposition in accordance with embodiments of the invention.

FIG. 10A depicts a block diagram illustrating a top-down view of the inactive region 310B (also shown in FIG. 5) before and after the film 802 has been conformally deposited over the inactive region 310B and the active region 320 (shown in FIG. 3) of the IC wafer layer 300 (shown in FIG. 3). In embodiments of the invention, the film 802 can be deposited using any suitable deposition process, including but not limited to CVD, plasma enhanced chemical vapor deposition (PECVD), atomic layer deposition (ALD), flowable CVD, spin-on dielectrics, and/or physical vapor deposition (PVD). As depicted in the rightmost image of FIG. 10A, the deposited film 802 has covered the top surface 330, the sidewalls 516, 536, and the bottom surfaces 514, 534 (shown in FIG. 5), thereby forming a first new cavity 1010 having first new sidewalls 1016 and a first new vertex 1020, along with forming a second new cavity 1030 having second new sidewalls 1036 and a second new vertex 1040. For reference, the triangular shape 510 of the cavity 512, the sidewalls 516, the vertex 520, the triangular shape 530 of the cavity 532, the sidewalls 536, and the vertex 540 are depicted as dotted lines to show their locations under the conformally deposited film 802. As shown in FIG. 10A, the new cavity 1010 tracks or matches the triangular shape 510 but has a smaller footprint that is positioned inside the triangular shape 510. Similarly, the new cavity 1030 tracks or matches the triangular shape 530 but has a smaller footprint that is positioned inside the triangular shape 530.

Figure 10B:
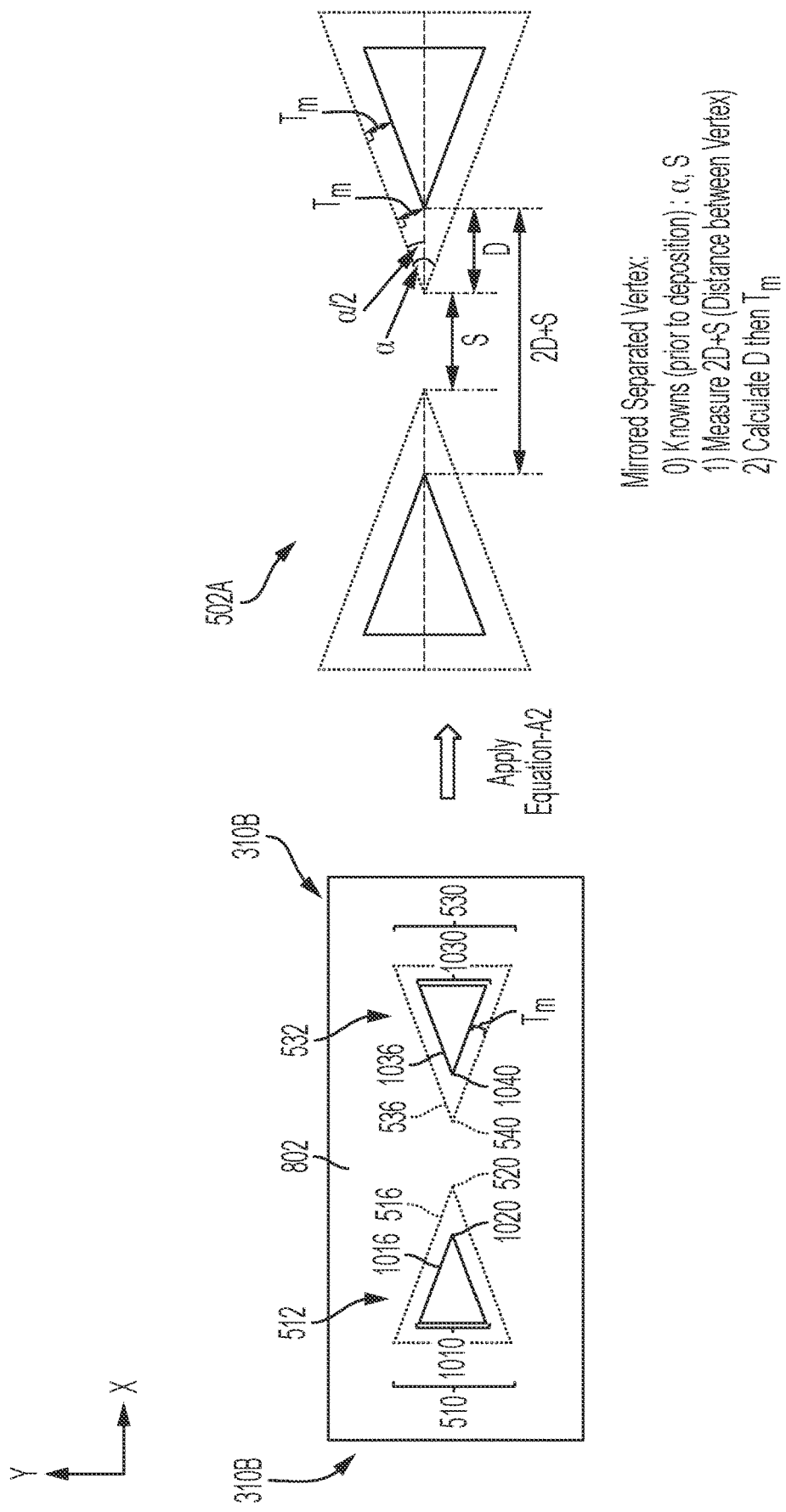
FIG. 10B depicts a block diagram illustrating top-down views of an angled geometric feature after film deposition in accordance with embodiments of the invention.

FIG. 10B depicts a block diagram illustrating the top-down view of the inactive region 310B (also shown in FIG. 5) after the film 802 has been conformally deposited over the inactive region 310B and the active region 320 (shown in FIG. 3) of the IC wafer layer 300 (shown in FIG. 3), along with a block diagram illustrating the application of Equation-A2. The leftmost post-film-deposition diagram shown in FIG. 10B is substantially the same as the rightmost post-film-deposition shown in FIG. 10A. The rightmost diagram in FIG. 10B is shown as a mirrored separated vertex shape 502A corresponding to the mirrored separated vertex shape 502 shown in FIG. 5.

Referring now to the inactive region 310B shown in FIG. 5, Equation-A2 shown in FIG. 7, and the top-down views of the inactive region 310B show in FIGS. 10A and 10B, an example of how the metrology (with vertices tracking) operations at block 128 (shown in FIG. 1) of the methodology 100 (shown in FIG. 1) can be performed in accordance with embodiments of the invention will now be described. By selecting the geometric shape (e.g., triangular) of the angled geometric features 512, 532, and by depositing the film 802 over the angled geometric features 512, 532, the new cavities 1010, 1030 have substantially the same geometric shape as the angled geometric features 512, 532, as well as a geometric relationship with the angled geometric features 512, 532. More specifically, the distance (shown in FIG. 10B as $T_m$) between, for example, the sidewall 536 of the angled geometric feature 532 and the sidewall 1036 of the second new cavity 1030 can be determined using Equation-A2, where $T_m$ is $T_{thickness}$. The system 200 (shown in FIG. 2) performs analysis to identify the variables in Equation-A2 such that the only unknown is $T_{thickness}$ (or $T_m$), and the thickness of the conformally deposited film 802 layer in the Z/X axes plane is the same as $T_{thickness}$ (or $T_m$) in the X/Y axes plane.

In accordance with aspects of the invention, and with reference to the mirrored separated vertex shape 502A shown in FIG. 10B, a measurement is taken after deposition of the film 802 between the newly created feature vertices 1020, 1040 to be defined as 2D+S as illustrated in the rightmost diagram of FIG. 10B. With S and the angle alpha (α) being known from the IC design, the unknown $T_{thickness}$ (or $T_m$) can be calculated using Equation-A2.

FIG. 11A depicts a block diagram illustrating a top-down view of the inactive region 310C (also shown in FIG. 6A) before and after the film 802 has been conformally deposited over the inactive region 310C and the active region 320 (shown in FIG. 3) of the IC wafer layer 300 (shown in FIG. 3). In embodiments of the invention, the film 802 can be deposited using any suitable deposition process, including but not limited to CVD, plasma enhanced chemical vapor deposition (PECVD), atomic layer deposition (ALD), flowable CVD, spin-on dielectrics, and/or physical vapor deposition (PVD). As depicted in the rightmost image of FIG. 11A, the deposited film 802 has covered the top surface 330, the sidewalls 616, and the bottom surfaces 614 (shown in FIG. 6A), thereby forming a first new cavity 1110 having first new sidewalls 1116 and a first new vertex 1120. For reference, the triangular shape 610 of the cavity 612, the sidewalls 616, and the vertex 620 are depicted as dotted lines to show their locations under the conformally deposited film 802. As shown in FIG. 11A, the new cavity 1110 tracks or matches the triangular shape 610 but has a smaller footprint that is positioned inside the triangular shape 610.

Figure 11B:
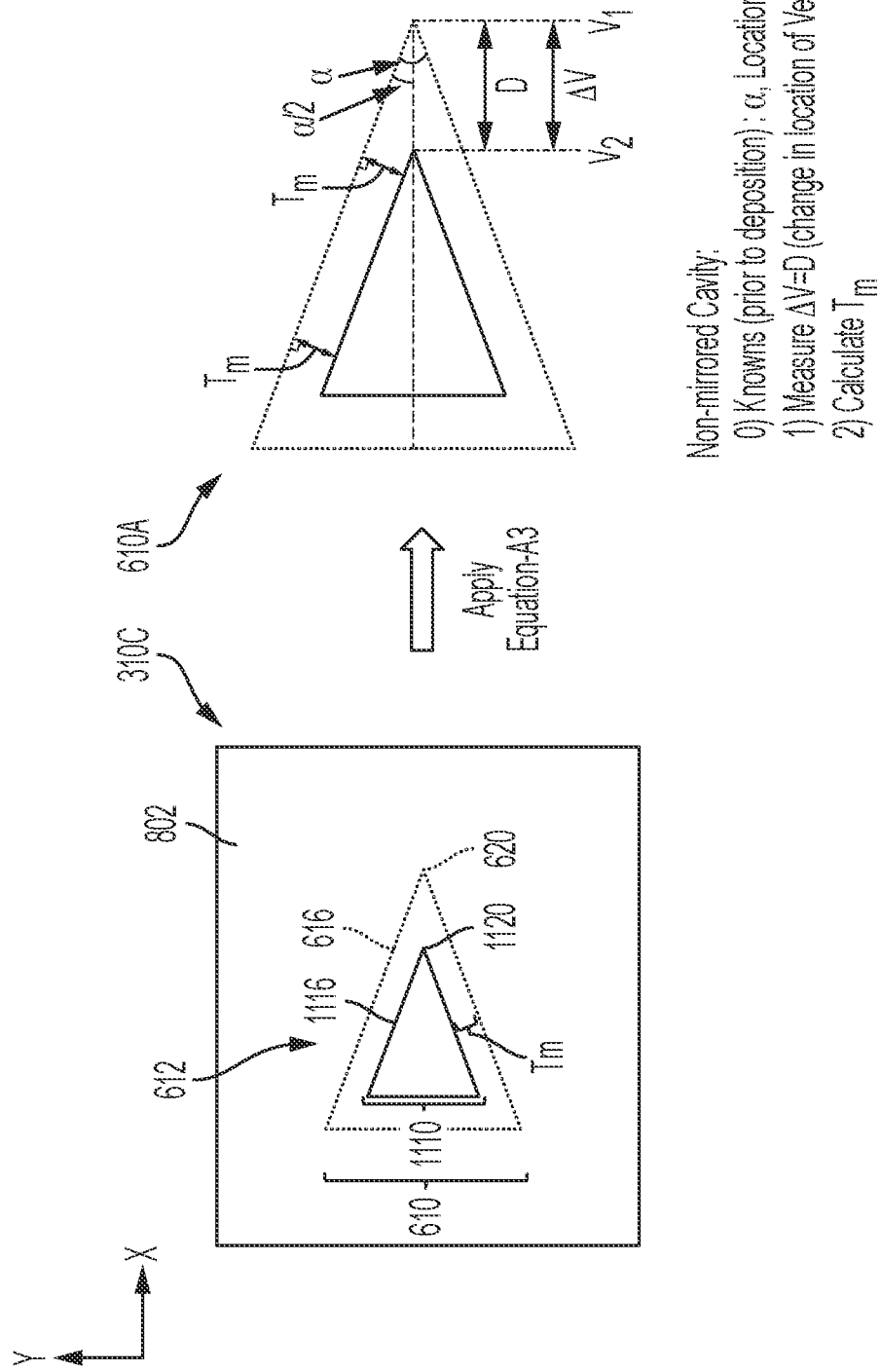
FIG. 11B depicts a block diagram illustrating top-down views of an angled geometric feature after film deposition in accordance with embodiments of the invention.

FIG. 11B depicts a block diagram illustrating the top-down view of the inactive region 310C (also shown in FIG. 6A) after the film 802 has been conformally deposited over the inactive region 310C and the active region 320 (shown in FIG. 3) of the IC wafer layer 300 (shown in FIG. 3), along with a block diagram illustrating the application of Equation-A3. The leftmost post-film-deposition diagram shown in FIG. 11B is substantially the same as the rightmost post-film-deposition shown in FIG. 11A. The rightmost diagram in FIG. 11B is shown as a non-mirrored cavity shape 610A corresponding to the non-mirrored cavity shape (i.e., the triangular shape 610) shown in FIGS. 6A and 11B.

Referring now to the inactive region 310C shown in FIG. 6A, Equation-A3 shown in FIG. 7, and the top-down views of the inactive region 310C show in FIGS. 11A and 11B, an example of how the metrology (with vertices tracking) operations at block 128 (shown in FIG. 1) of the methodology 100 (shown in FIG. 1) can be performed in accordance with embodiments of the invention will now be described. By selecting the geometric shape (e.g., triangular) of the angled geometric feature 612, and by depositing the film 802 over the angled geometric feature 612, the new cavity 1110 has substantially the same geometric shape as the angled geometric features 612, as well as a geometric relationship with the angled geometric feature 612. More specifically, the distance (shown in FIG. 11B as $T_m$) between, for example, the sidewall 616 of the angled geometric feature 612 and the sidewall 1116 of the new cavity 1110 can be determined using Equation-A3, where $T_m$ is $T_{thickness}$. The system 200 (shown in FIG. 2) performs analysis to identify the variables in Equation-A3 such that the only unknown is $T_{thickness}$ (or $T_m$), and the thickness of the conformally deposited film 802 layer in the Z/X-axes plane is the same as $T_{thickness}$ (or $T_m$) in the X/Y axes plane.

In accordance with aspects of the invention, and with reference to the non-mirrored cavity shape 610A shown in FIG. 11B, measurements are taken after deposition of additive film 802 where the change in vertex position before and after deposition is determined. The change in position of vertex 620 and the vertex 1120 serves as the distance D (or Delta Vertex) as illustrated in FIG. 11B. With D being determined and the angle alpha (α) being know from the IC design, the unknown $T_{thickness}$ (or $T_m$) can be calculated. It is noted that changes between the location of vertex 620 and vertex 1120 may require separate measurement steps.

Figure 11C:
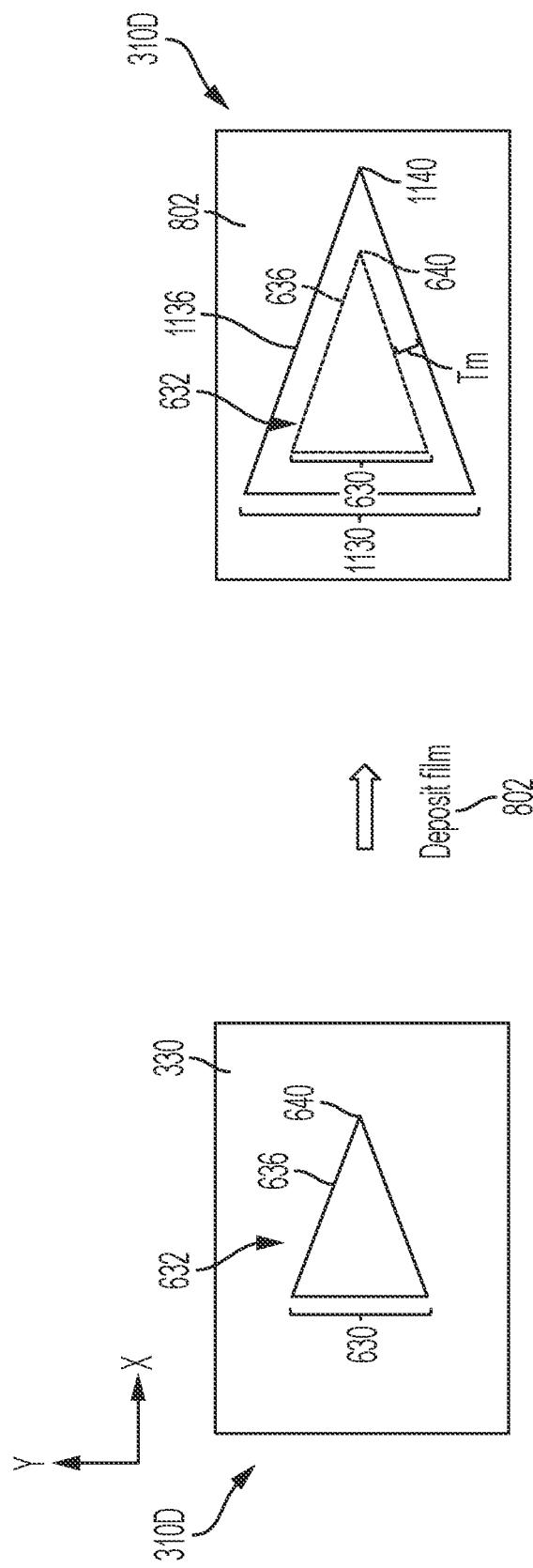
FIG. 11C depicts a block diagram illustrating top-down views of an angled geometric feature before and after film deposition in accordance with embodiments of the invention.

FIG. 11C depicts a block diagram illustrating a top-down view of the inactive region 310D (also shown in FIG. 6B) before and after the film 802 has been conformally deposited over the inactive region 310D and the active region 320 (shown in FIG. 3) of the IC wafer layer 300 (shown in FIG. 3). In embodiments of the invention, the film 802 can be deposited using any suitable deposition process, including but not limited to CVD, plasma enhanced chemical vapor deposition (PECVD), atomic layer deposition (ALD), flowable CVD, spin-on dielectrics, and/or physical vapor deposition (PVD). As depicted in the rightmost image of FIG. 11C, the deposited film 802 has covered the top surface 330, the sidewalls 636, and the top surface 634 (shown in FIG. 6B), thereby forming a new protrusion 1130 having new sidewalls 1136 and a new vertex 1140. For reference, the triangular shape 630 of the protrusion 632, the sidewalls 636, and the vertex 640 are depicted as dotted lines to show their locations under the conformally deposited film 802. As shown in FIG. 11C, the new protrusion 1130 tracks or matches the triangular shape 630 but has a larger footprint that is positioned over and around the triangular shape 630.

Figure 11D:
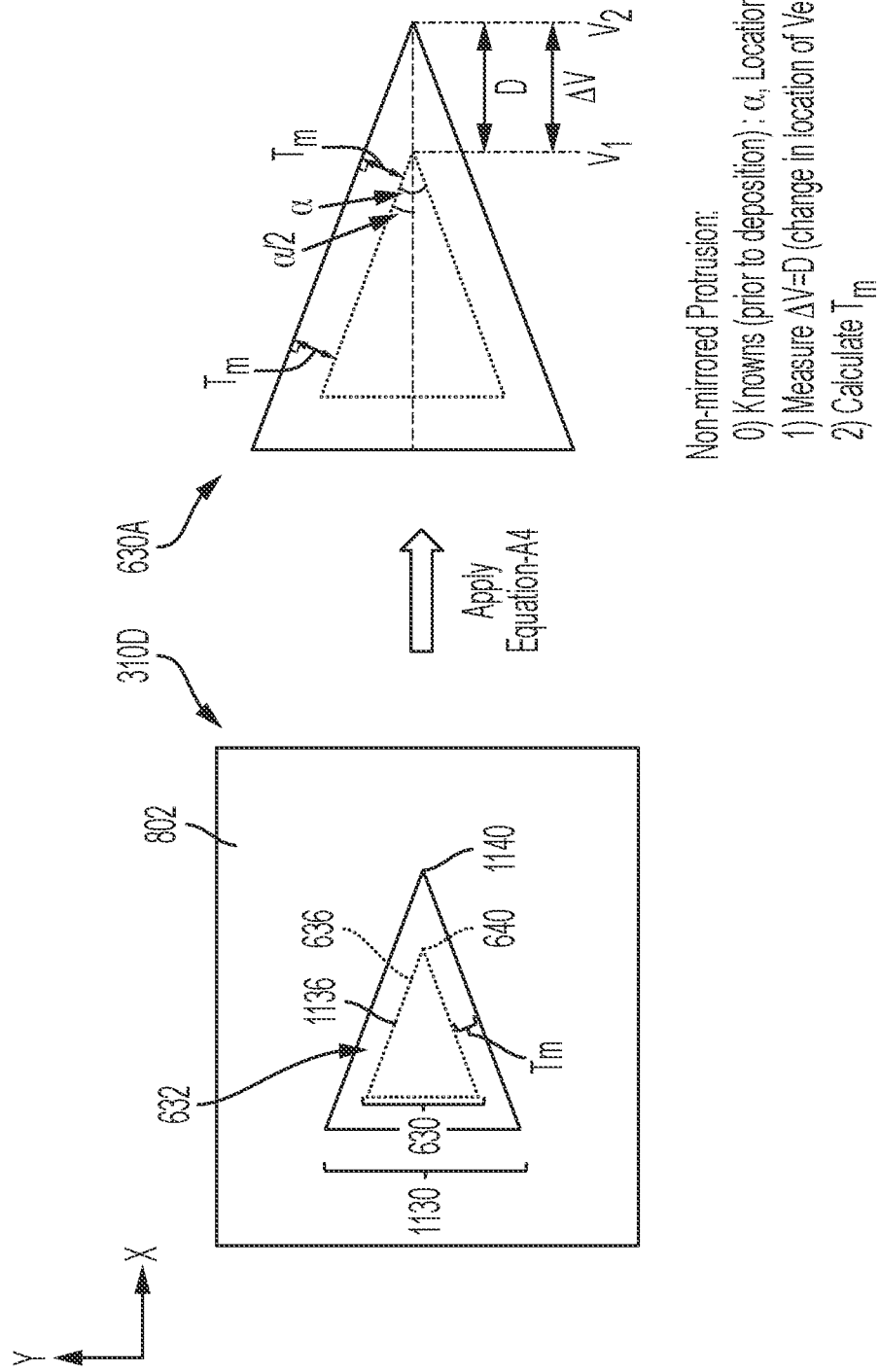
FIG. 11D depicts a block diagram illustrating top-down views of an angled geometric feature after film deposition in accordance with embodiments of the invention.

FIG. 11D depicts a block diagram illustrating the top-down view of the inactive region 310C (also shown in FIG. 6A) after the film 802 has been conformally deposited over the inactive region 310C and the active region 320 (shown in FIG. 3) of the IC wafer layer 300 (shown in FIG. 3), along with a block diagram illustrating the application of Equation-A3. The leftmost post-film-deposition diagram shown in FIG. 11D is substantially the same as the rightmost post-film-deposition shown in FIG. 11C. The rightmost diagram in FIG. 11D is shown as a non-mirrored protrusion shape 630A corresponding to the non-mirrored protrusion shape (i.e., the triangular shape 630) shown in FIGS. 6B and 11D.

Referring now to the inactive region 310D shown in FIG. 6B, Equation-A4 shown in FIG. 7, and the top-down views of the inactive region 310D show in FIGS. 11A and 11B, an example of how the metrology (with vertices tracking) operations at block 128 (shown in FIG. 1) of the methodology 100 (shown in FIG. 1) can be performed in accordance with embodiments of the invention will now be described. By selecting the geometric shape (e.g., triangular) of the angled geometric feature 632, and by depositing the film 802 over the angled geometric feature 632, the new protrusion 1130 has substantially the same geometric shape as the angled geometric feature 632, as well as a geometric relationship with the angled geometric feature 632. More specifically, the distance (shown in FIG. 11D as $T_m$) between, for example, the sidewall 636 of the angled geometric feature 632 and the sidewall 1136 of the new protrusion 1130 can be determined using Equation-A4, where $T_m$ is $T_{thickness}$. The system 200 (shown in FIG. 2) performs analysis to identify the variables in Equation-A4 such that the only unknown is $T_{thickness}$ (or $T_m$), and the thickness of the conformally deposited film 802 layer in the Z/X-axes plane is the same as $T_{thickness}$ (or $T_m$) in the X/Y axes plane.

In accordance with aspects of the invention, and with reference to the non-mirrored protrusion shape 630A shown in FIG. 11D, measurements are taken after deposition of additive film 802 where the change in vertex position before and after deposition is determined. The change in position of vertex 640 and the vertex 1140 serves as the distance D (or Delta Vertex) as illustrated in FIG. 11D. With D being determined and the angle alpha (α) being know from the IC design, the unknown $T_{thickness}$ (or $T_m$) can be calculated. It is noted that changes between the location of vertex 640 and vertex 1140 may require separate measurement steps.

Figure 12:
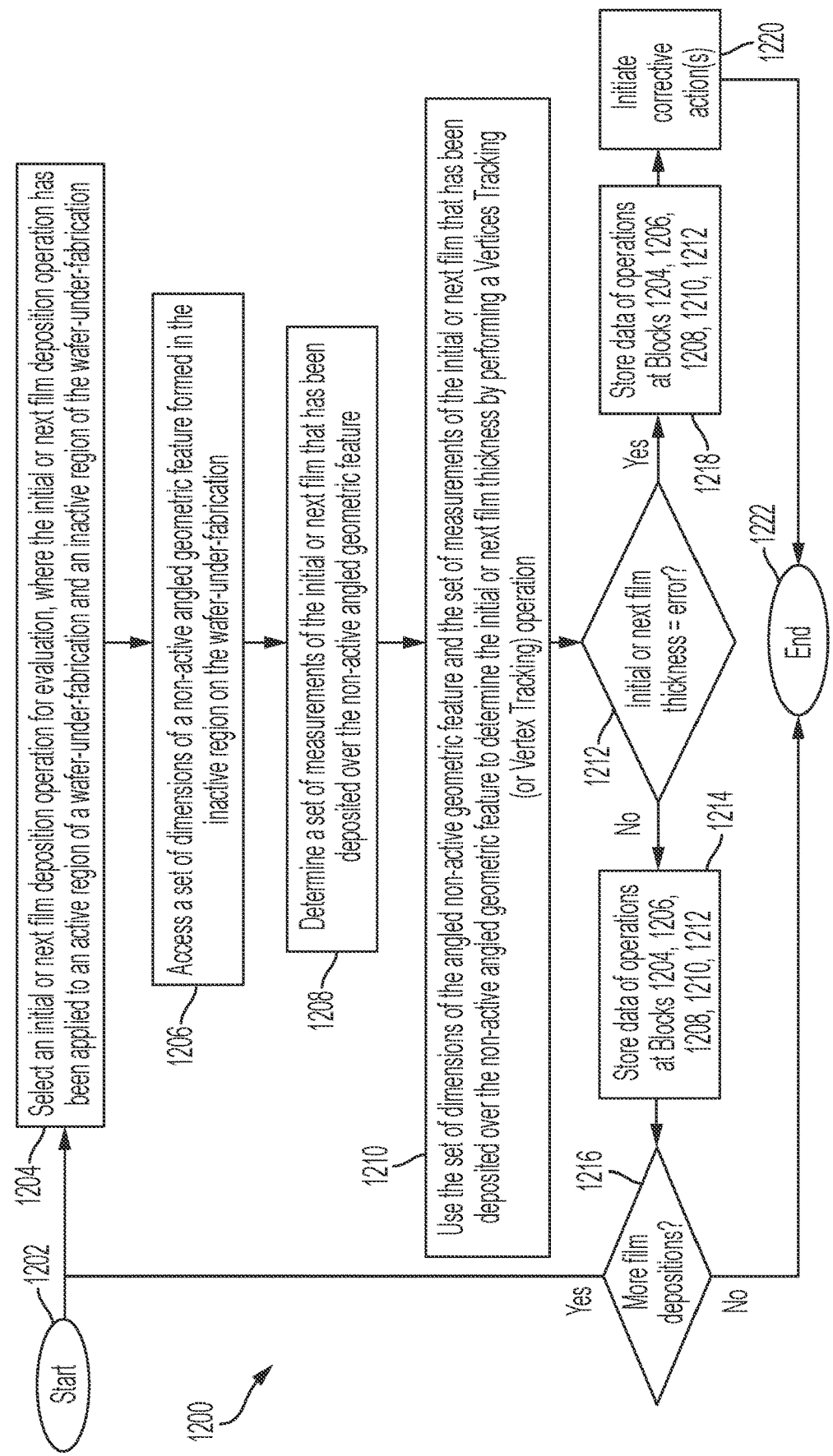
FIG. 12 depicts a flow diagram illustrating a methodology in accordance with embodiments of the invention.

FIG. 12 depicts a methodology 1200 embodying aspects of the invention. In accordance with embodiments of the invention, the methodology 1200 is performed using the controller 220 (shown in FIG. 2) to control operations of the IC fabrication systems 210 (shown in FIG. 2) and the inline metrology system 212 (shown in FIG. 2). The methodology 1200 starts at block 1202 then moves to block 1204 where an initial or next film deposition operation is selected for evaluation. In accordance with embodiments of the invention, critical film thickness measurements can be identified, and block 1204 can be configured to select for evaluation, the film deposition operations that correspond to the identified critical thickness measurements. The initial or next film deposition operation has been applied to an active region (e.g., active region 320 shown in FIG. 3) and inactive region (e.g., inactive region 310 shown in FIG. 3) of an IC wafer-under-fabrication (e.g., IC wafer layer 300 shown in FIG. 3).

At block 1206, a set of dimensions of a non-active angled geometric feature formed in the inactive region of the wafer-under-fabrication are accessed. In some embodiments of the invention, the set of dimensions can be accessed from sources such as the IC design associated with the wafer-under-fabrication. The set of dimensions can include dimensions that facilitate determining values for the variables (other than $T_{thickness}$) in Equation-A1, Equation-A2, Equation-A3, and/or Equation-A4 shown in FIG. 7.

At block 1208, a set of measurements of the initial or next film that has been deposited over the non-active angled geometric feature formed in the inactive region of the wafer-under-fabrication are performed. In some embodiments of the invention, the measurements are performed by the inline metrology system 212 under control of the controller 220. In some embodiments of the invention, the set of measurements can be used directly or after additional computations to determine values for the variables (other than $T_{thickness}$) in Equation-A1, Equation-A2, Equation-A3, and/or Equation-A4 shown in FIG. 7. In embodiments of the invention, the set of measurements at block 1208 can be a single measurement or multiple measurements. In some embodiments of the invention, the set of measurements performed at block 1208 are optional.

At block 1210, the controller 220 uses the set of accessed dimensions and the set of measurements to determine an initial or next film's thickness by performing a vertices tracking (or vertex tracking) operation in accordance with embodiments of the invention. The operations at block 1210 can be implemented using, for example, the metrology (with vertices tracking) operations depicted at block 128 of the methodology 100 shown in FIG. 1 described in greater detail previously herein. The operations at block 1210 can also be performed in accordance with the examples depicted at FIGS. 7-11B and described in greater detail previously herein.

A decision block 1212, the methodology 1200 determines whether or not the film thickness determined at block 1210 represents an error. In embodiment of the invention, the error determination at decision block 1212 can based on whether or not the actual deposited thickness determined at block 1210 falls within a range of acceptable values. If the answer to the inquiry at decision block 1212 is no, the methodology 1200 moves to block 1214 and stores data of the operations performed at blocks 1204, 1206, 1208, 1210, 1212. In some embodiments of the invention, the operations at block 1214 can be performed through out the various operations of the methodology 1200. From block 1214, the methodology 1200 moves to decision block 1216 to determine whether or not and additional film has been deposited that needs evaluation. If the answer to inquiry at decision block 1216 is yes, the methodology 1200 returns to block 1204 for another iteration of the methodology 1200 on a next film deposition. If the answer to the inquiry at decision block 1216 is no, the methodology 1200 moves to block 1222 and ends.

Returning to decision block 1212, if the answer to the inquiry at decision block 1212 is yes, the methodology 1200 moves to block 1218 and stores data of the operations performed at blocks 1204, 1206, 1208, 1210, 1212. In some embodiments of the invention, the operations at block 1214 can be performed throughout the various operations of the methodology 1200. From block 1218, the methodology 1200 moves to block 1220 to initiate corrective action that is responsive to the error determined at decision block 1212. From block 1220, the methodology 1200 moves to block 1222 and ends.

Figure 13:
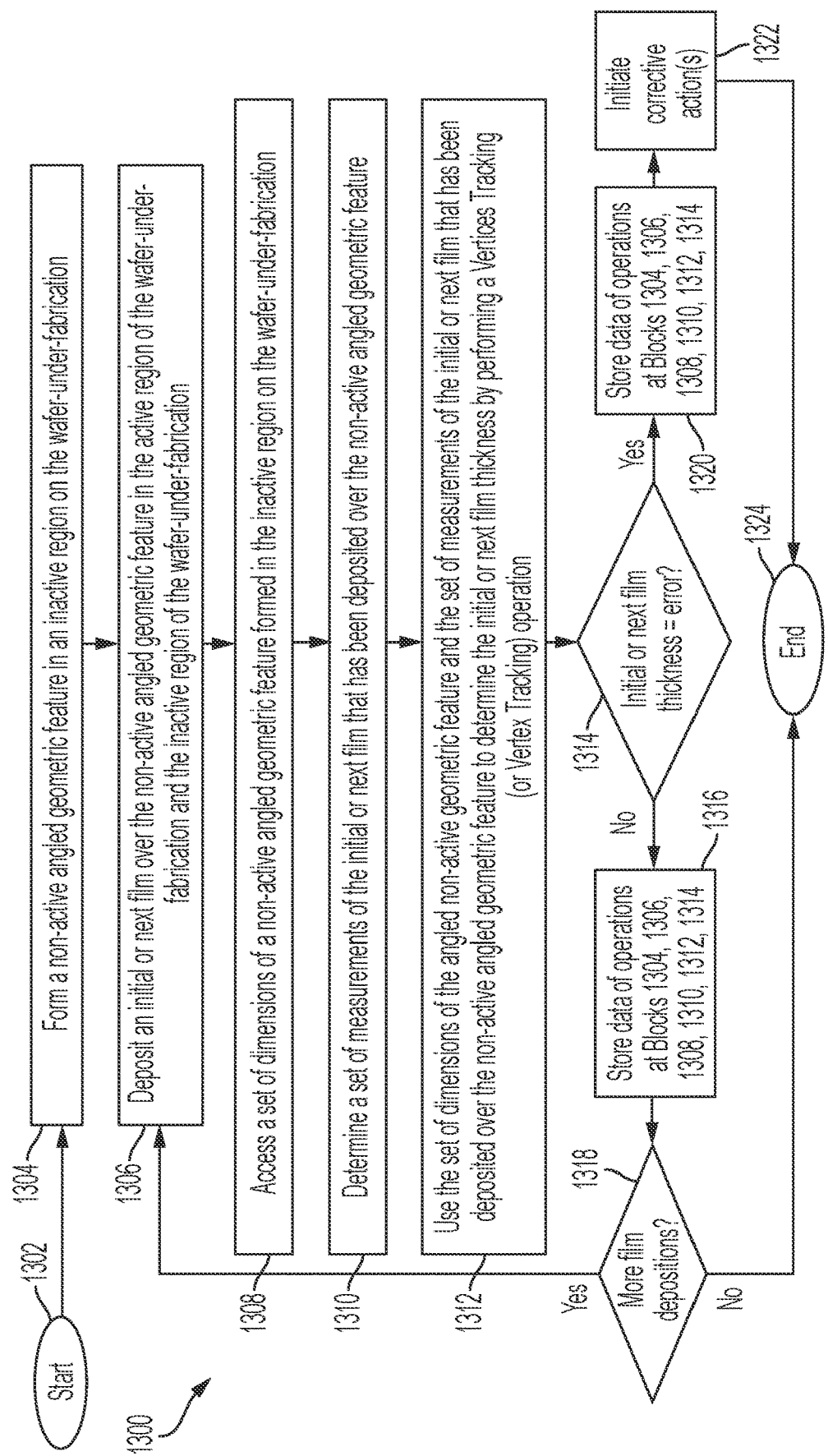
FIG. 13 depicts a flow diagram illustrating a methodology in accordance with embodiments of the invention.

FIG. 13 depicts a methodology 1300 embodying aspects of the invention. In accordance with embodiments of the invention, the methodology 1300 is performed using the controller 220 (shown in FIG. 2) to control operations of the IC fabrication systems 210 (shown in FIG. 2) and the inline metrology system 212 (shown in FIG. 2). The methodology 1300 is substantially the same as the methodology 1200 (shown in FIG. 12) except in the methodology 1300, block 1304 forms a non-active angled geometric feature in an active region of the wafer-under-fabrication; and block 1306 deposits an initial or next film over the non-active angled geometric feature in the active region of the wafer-under-fabrication and the inactive region of the wafer-under-fabrication. The remaining operations in blocks 1308, 1310, 1312, 1314, 1316, 1318, 1320, 1322 of methodology 1300 correspond to the operations in blocks 1206, 1208, 1210, 1212, 1214, 1216, 1218, 1220 of methodology 1200.

Figure 14:
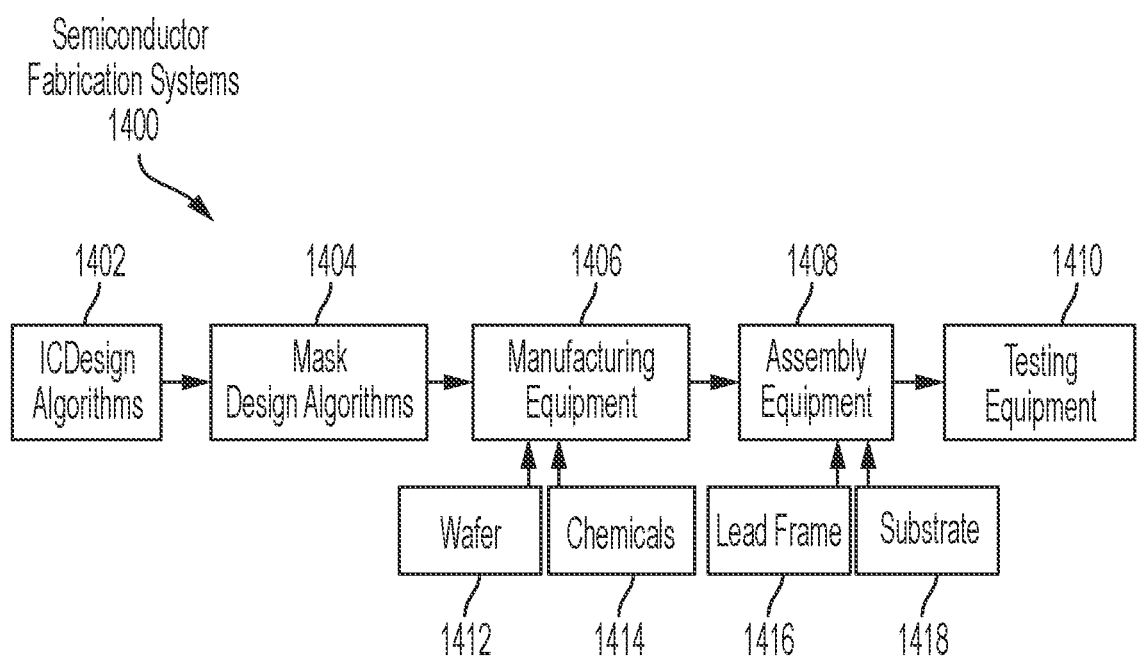
FIG. 14 depicts a block diagram illustrating a semiconductor fabrication system capable of implementing embodiments of the invention.

FIG. 14 depicts a block diagram illustrating semiconductor fabrication systems 1400 that supports semiconductor fabrication processes capable of incorporating aspects of the invention. The semiconductor fabrication systems 1400 includes IC design support algorithms 1402, mask design support algorithms 1404, manufacturing support equipment 1406, assembly support equipment 1408, and testing support equipment 1410, configured and arranged as shown. The IC design support algorithms 1402 are configured and arranged to provide computer-aided-design (CAD) assistance with the design of the logic circuits (AND, OR, and NOR gates) that form the various logic components of the IC. Similarly, the mask design support algorithms 1404 are configured and arranged to provide CAD assistance with generating the mask design, which is the representation of an IC in terms of planar geometric shapes that correspond to the patterns of metal, oxide, or semiconductor layers that make up the components of the IC. The mask design places and connects all of the components that make up the IC such that they meet certain criteria, such as performance, size, density, and manufacturability. The manufacturing equipment 1406 is the equipment used in executing the FEOL, MOL, BEOL, and Far-BEOL processes (including singulation processes) used to form the finished wafers and IC chips (or semiconductor die). In general, the wafer manufacturing equipment 1406 come in various forms, most of which specialize in growing, depositing or removing materials from a wafer. Examples of wafer manufacturing equipment 1406 include oxidation systems, epitaxial reactors, diffusion systems, ion implantation equipment, physical vapor deposition systems, chemical vapor deposition systems, photolithography equipment, etching equipment, polishing equipment and the like. The various types of manufacturing equipment 1402 take turns in depositing and removing (e.g., using the chemicals 1414) different materials on and from the wafer 1412 in specific patterns until a circuit is completely built on the wafer 1412. The assembly equipment 1408 is used to package the IC chips into finished IC packages that are physically ready for use in customer applications. The assembly equipment 1408 can include wafer back-grind systems, wafer saw equipment, die attach machines, wire-bonders, die overcoat systems, molding equipment, hermetic sealing equipment, metal can welders, DTFS (de-flash, trim, form, and singulation) machines, branding equipment, and lead finish equipment. The major components used by the assembly equipment 1408 include but are not limited to lead frames 1416 and substrates 1418. The test equipment 1410 is used to test the IC packages so that only known good devices will be shipped to customers. Test Equipment 1410 can include automatic test equipment (ATE); test handlers; tape and reel equipment; marking equipment; burn-in ovens; retention bake ovens; UV (ultraviolet) erase equipment, and vacuum sealers.

Figure 15:
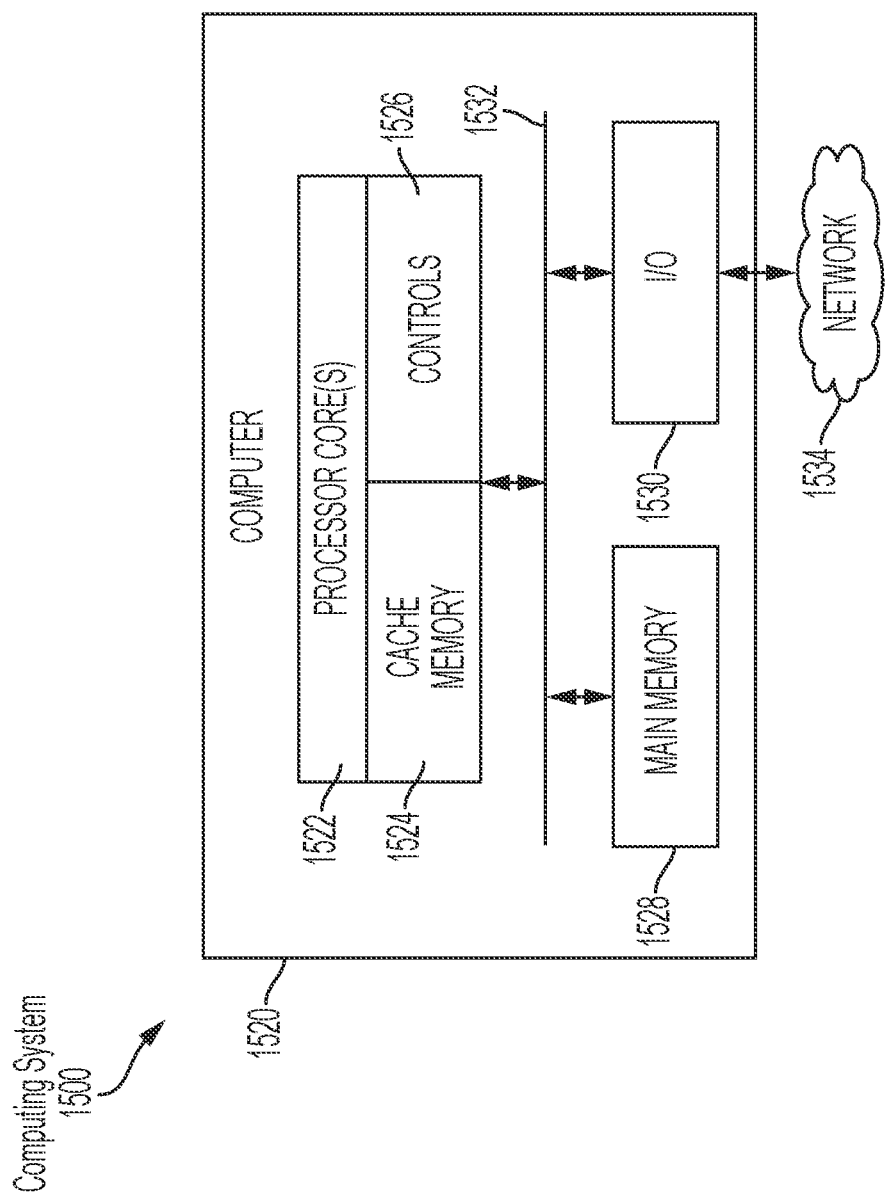
FIG. 15 depicts a block diagram illustrating a computing system capable of implementing embodiments of the invention.

FIG. 15 illustrates an example of the computing system 1500 that can be used to implement any of the computer-based components of the various embodiments of the invention described herein. The computing system 1500 includes an exemplary computing device ("computer") 1502 configured for performing various aspects of the content-based semantic monitoring operations described herein in accordance aspects of the invention. In addition to computer 1502, exemplary computing system 1500 includes network 1514, which connects computer 1502 to additional systems (not depicted) and can include one or more wide area networks (WANs) and/or local area networks (LANs) such as the Internet, intranet(s), and/or wireless communication network(s). Computer 1502 and additional system are in communication via network 1514, e.g., to communicate data between them.

Exemplary computer 1502 includes processor cores 1504, main memory ("memory") 1510, and input/output component(s) 1512, which are in communication via bus 1503. Processor cores 1504 includes cache memory ("cache") 1506 and controls 1508, which include branch prediction structures and associated search, hit, detect and update logic, which will be described in more detail below. Cache 1506 can include multiple cache levels (not depicted) that are on or off-chip from processor 1504. Memory 1510 can include various data stored therein, e.g., instructions, software, routines, etc., which, e.g., can be transferred to/from cache 1506 by controls 1508 for execution by processor 1504. Input/output component(s) 1512 can include one or more components that facilitate local and/or remote input/output operations to/from computer 1502, such as a display, keyboard, modem, network adapter, etc. (not depicted).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and in that manner the conductors, insulators and selectively doped regions are built up to form the final device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A multi-layered integrated circuit (IC) comprising:
    an IC layer having an inactive region and an active region;
    wherein the active region comprises an active device;
    wherein the inactive region comprises an inactive feature comprising a geometric feature having a geometric shape that extends along an X-axis, a Y-axis, and a Z-axis;
    a film over the active device and the geometric feature;
    wherein a first portion of the film is part of the active device;
    wherein a second portion of the film is over the geometric feature such that a geometric shape of the film matches the geometric shape of the geometric feature;
    wherein a footprint of the geometric shape of the film in the plane defined by the X-axis and the Y-axis is different from a footprint of the geometric shape of the geometric feature in the plane defined by the X-axis and the Y-axis; and
    wherein a thickness of the film in a plane defined by the Z-axis and the X-axis comprises a difference between:
        the footprint of the geometric shape of the film in the plane defined by the X-axis and the Y-axis; and
        the footprint of the geometric shape of the geometric feature in the plane defined by the X-axis and the Y-axis.

2. The multi-layered IC of claim 1, wherein the geometric feature comprises a cavity.

3. The multi-layered IC of claim 2, wherein the footprint of the geometric shape of the film in the plane defined by the X-axis and the Y-axis is less than the footprint of the geometric shape of the geometric feature in the plane defined by the X-axis and the Y-axis.

4. The multi-layered IC of claim 1, wherein the geometric feature comprise a protrusion.

5. The multi-layered IC of claim 4, wherein the footprint of the geometric shape of the film in the plane defined by the X-axis and the Y-axis is less than the footprint of the geometric shape of the geometric feature in the plane defined by the X-axis and the Y-axis.

6. The multi-layered IC of claim 1, wherein the geometric shape comprises a triangular shape.

7. The multi-layered IC of claim 1, wherein the geometric shape comprises a first triangular shape and a second triangular shape.

8. The multi-layered IC of claim 7, wherein the first triangular shape is a mirror image of the second triangular shape in the plane defined by the X-axis and the Y-axis.

9. The multi-layered IC of claim 7, wherein:
    the first triangular shape comprises a first vertex;
    the second triangular shape comprises a second vertex;
    the first triangular shape is a mirror image of the second triangular shape in the plane defined by the X-axis and the Y-axis;
    the first triangular shape comprises a first vertex;
    the second triangular shape comprises a second vertex;
    the first vertex and the second vertex meet such that the first triangular shape and the second triangular shape are in a bow-tie shaped configuration; and
    an angle of the first vertex and an angle of the second vertex are based at least in part on an expected thickness of the film.

* * * * *